US012812853B2

(12) United States Patent
Mangu et al.

(10) Patent No.: US 12,812,853 B2
(45) Date of Patent: Nov. 24, 2026

(54) FLOATING GATE NAND CELL—METHODS AND APPROACHES FOR FABRICATION

(71) Applicant: Intel NDTM US LLC, Santa Clara, CA (US)

(72) Inventors: Vijay Saradhi Mangu, Sunnyvale, CA (US); Henok T. Mebrahtu, Rio Rancho, NM (US); Randy J. Koval, Boise, ID (US)

(73) Assignee: INTEL NDTM US LLC, Santa Clara, CA (US)

( * ) Notice: Subject to any disclaimer, the term of this patent is extended or adjusted under 35 U.S.C. 154(b) by 123 days.

(21) Appl. No.: 18/368,787

(22) Filed: Sep. 15, 2023

(65) Prior Publication Data

US 2024/0008270 A1 Jan. 4, 2024

(51) Int. Cl.

| | |
|---|---|
| ***H10B 41/35*** | (2023.01) |
| ***H10B 41/27*** | (2023.01) |
| ***H10B 43/27*** | (2023.01) |
| ***H10B 43/35*** | (2023.01) |

(52) U.S. Cl.

CPC ............. *H10B 41/35* (2023.02); *H10B 41/27* (2023.02); *H10B 43/27* (2023.02); *H10B 43/35* (2023.02)

(58) Field of Classification Search

CPC ........ H10B 41/35; H10B 41/27; H10B 43/27; H10B 43/35; H10D 64/035; H10W 10/021; H10W 10/20

See application file for complete search history.

(56) References Cited

U.S. PATENT DOCUMENTS

2019/0043960 A1* 2/2019 Koval ................ H10D 30/6891
2019/0198510 A1* 6/2019 Kim ....................... H10B 41/10

* cited by examiner

*Primary Examiner* — Jonathan Han

(74) *Attorney, Agent, or Firm* — Morgan, Lewis & Bockius LLP

(57) ABSTRACT

Methods and approaches for fabricating floating gate NAND cells and associated memory devices. A stacked layer structure comprising alternating layers of polysilicon and silicon nitride is fabricated, and an array of memory hole passing vertically through the alternating layers of polysilicon and silicon nitride are formed. Multiple films of materials, such as silicon oxide, silicon nitrides, and polysilicon are sequentially formed over sidewalls of the memory holes during in-memory hole processing. The back-side processing begins with removal of silicon nitride layers (dielectric spacers between wordlines) using an etchant introduced through replacement holes which enables inter-wordline airgaps between FG memory cells in adjacent polysilicon layers. Etching processes selective to silicon oxide and silicon nitride are performed to form the gate, inter-poly dielectric (IPD) layers, and the storage node of the FG memory cells. The films formed during the in-memory hole processing that are not etched comprise the channels.

20 Claims, 18 Drawing Sheets

CIRCUIT 500

1300a
616
614
Airgap
1306
610
1304
606
1302
602
624
P

1300b
Etch
624 (typ)

1300c
1308 (typ)
624
626

1300d
1310 (typ)
628

1300e
1312 (typ)
630

FLOATING GATE NAND CELL—METHODS AND APPROACHES FOR FABRICATION

BACKGROUND INFORMATION

Three-dimensional (3D) NAND technologies are commonly used to create nonvolatile (NV) storage devices, such as solid-state drives (SSDs). Reference to 3D NAND can more specifically refer to NAND flash. Unlike convention 2D memory devices, 3D NAND memory devices have one or more decks comprising layers of circuit elements that are stacked on top of one another. The circuit elements are connected via channels in vertical structures (e.g., memory holes, pillars) having high depth to width aspect ratios (AR).

Fabricating memory cells in 3D memory devices having high AR vertical structures poses significant challenges. For example, as the number of memory layers increases and the depth of memory holes/pillars increases, the uniformity of the memory cell structures vary between top and bottom wordlines, leading to reliability issues. This limits memory device scaling.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
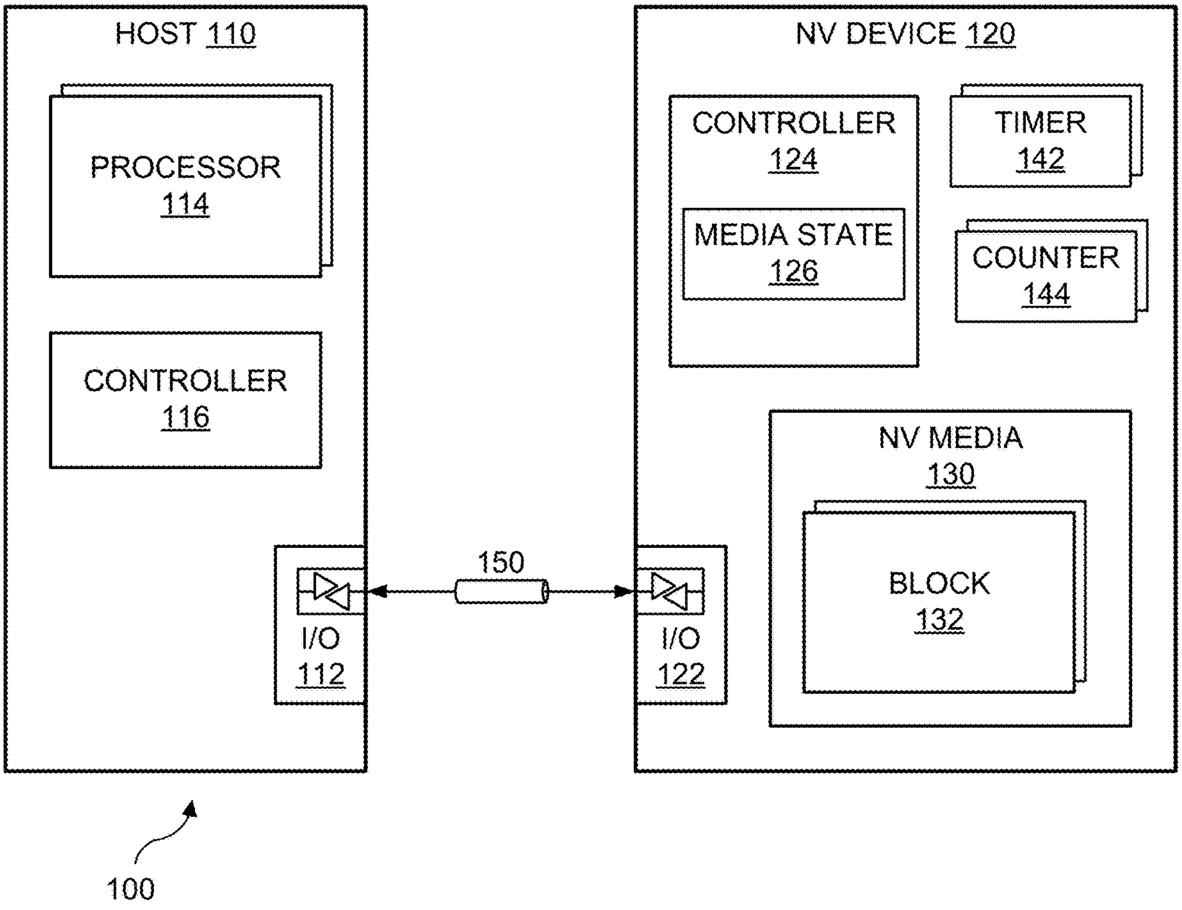
FIG. 1 is a block diagram of an example of a system that stores data in Non-volatile (NV) media.

Embodiments of methods and approaches for fabricating floating gate NAND cells and associated memory devices are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

FIG. 1 is a block diagram of an example of a system that stores data in Non-volatile (NV) media. System 100 includes host 110 coupled to NV device 120. Host 110 represents a computing device. Host 110 includes I/O (input/output) 112, which represents hardware to interconnect with NV device 120. NV device 120 includes I/O 122 which corresponds to I/O 112. I/O 122 represents hardware to interconnect with host 110.

Host 110 provides a hardware platform to operate NV device 120. Host 110 includes one or more processors 114 to perform the operations of host 110. Processor 114 executes a host operating system (OS) that provides a software platform for the operation of NV device 120. The hardware platform provides hardware resources to interface with NV device 120 including transceiver hardware to perform access to the device. The software platform includes control software to execute other software elements such as applications or other agents that execute under the OS and create requests to access NV device 120.

I/O 112 and I/O 122 interconnect through one or more signal lines 150. Signal lines 150 typically include multiple separate lines and can be considered one or more buses to connect host 110 to NV device 120. Host 110 can send a host read command over signal line 150 to NV device 120. In response to the read command, NV device 120 services the request out of a transient Vt state, in accordance with any example provided.

In one example, host 110 includes controller 116. Controller 116 represents a memory controller or storage controller. In one example, controller 116 is integrated with processor 114. In one example, controller 116 is separate from processor 114. Controller 116 enables host 110 to manage access to NV device 120. In response to host operations by processor 114 that request access to data on NV device 120, controller 116 provides access to NV device 120. Controller 116 can represent hardware and firmware elements of host 110 to enable interaction with NV device 120.

NV device 120 includes controller 124, which represents a storage controller at the side of the storage device, which is separate from controller 116 of host 110. Controller 116 of host 110 represents components of the host system. Controller 124 represents components of the storage device or memory device into which the NV media is incorporated. Controller 124 receives commands sent from host 110 and determines how to service the command or request from the host. Controller 124 performs operations to access (e.g., read or write) NV media 130 in response to the host command.

NV media 130 represents a nonvolatile storage media of NV device 120. In one example, NV media 130 includes three-dimensional (3D) NAND (not AND) memory cells. In one example, NV media 130 includes 3D NOR memory cells. In one example, NV media 130 includes 3D crosspoint (XPOINT™) memory cells.

NV media 130 includes bitcells or memory cells organized as blocks 132. A block of memory refers to a portion of NV media 130 that is jointly charged or activated for an access operation. In one example, blocks 132 are subdivided as subblocks. In one example, a block refers to bitcells that share a select gate line. In one example, multiple subblocks share a select gate (e.g., a common select gate source (SGS) or a common select gate drain (SGD)) connector.

In one example, a block refers to an erase unit, or a unit size of NV media 130 that is erased together and monitored by controller 124 for number of writes. In one example, NV media 130 includes single level cell (SLC) and multilevel cell (MLC) media. For example, NV media 130 can include SLC and QLC (quad level cell) or SLC and TLC (triple level cell) bitcells. The block size could be different depending on the media type.

In one example, controller 124 is an ASIC (application specific integrated circuit) that controls operation of NV device 120. In one example, controller 124 is a CPU (central processing unit) core or processor device on NV device 120. In one example, NV device 120 represents an SSD and controller 124 controls multiple NV media dies or NV media chips integrated into the SSD. In one example, NV device 120 represents a module or PCB (printed circuit board) that includes multiple NV media dies or NV media chips integrated onto it and controller 124 controls the NV media dies of the module. In one example, controller 124 executes firmware to manage NV device 120. In one example, controller 124 executes firmware to manage NV device 120, including firmware to control the servicing of a read command based on whether the NV media is in thermal equilibrium.

In one example, controller 124 manages Vt state detection and read command servicing based on idle time or delay between consecutive read commands. In one example, controller 124 monitors one or more media states 126. Media state 126 represents a state of a portion of memory (such as a block) and can determine how to access the media based on media state 126. For example, if media state 126 indicates that a target block is in a stable state, controller 124 can first issue a dummy read prior to accessing the target block. In one example NV media devices 120 may include one or more timers 142 and counters 144.

Figure 2:
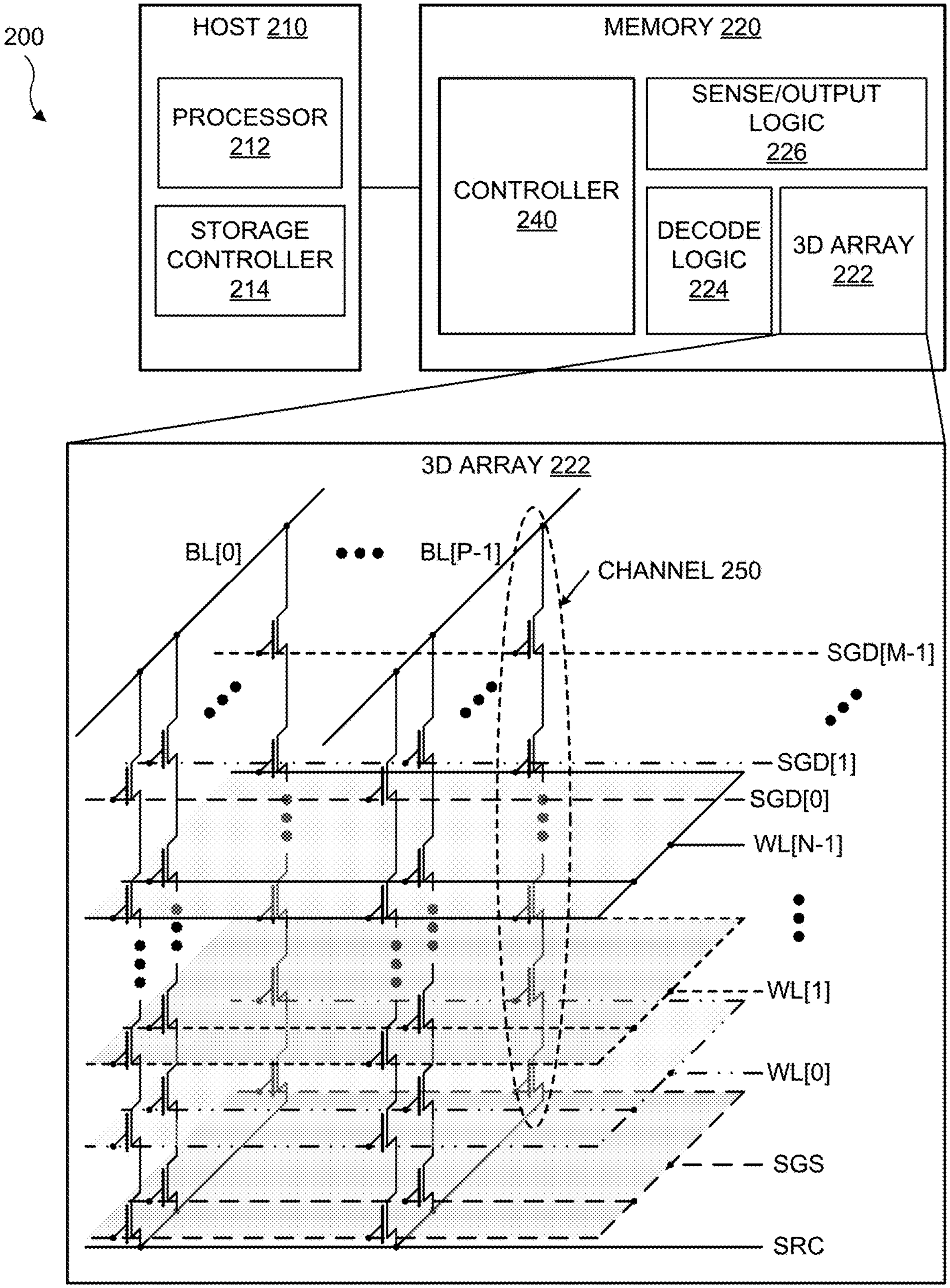
FIG. 2 is a block diagram of an example of system including a three-dimensional (3D) memory device structure.

FIG. 2 is a block diagram of an example system illustrating further details of a 3D memory device structure. System 200 represents a computing device that includes a 3D memory. Host 210 represents a hardware platform that performs operations to control the functions of system 200. Host 210 includes processor 212, which is a host processor that executes the operations of the host. In one example, processor 212 is a single-core processor. In one example, processor 212 is a multicore processor device. Processor 212 can be a general-purpose processor that executes a host operating system or a software platform for system 200. In one example, processor 212 is an application specific processor, a graphics processor, a peripheral processor, or other controller or processing unit on host 210. Processor 212 executes multiple agents or software programs (not specifically shown). The agents can be standalone programs and/or threads, processes, software modules, or other code and data to be operated on by processor 212.

During execution of operations by processor 212, an agent executed by the processor can request data and/or code that is not stored at host 210 (e.g., in a cache or main memory), and therefore should be obtained from memory 220. Storage controller 214 generates and processes memory access commands to memory 220 to perform the memory access. Storage controller 214 represents a circuit or logic or processor that manages access to memory 220. In one example, storage controller 214 is part of host 210. In one example, storage controller 214 is part of processor 212. In one example, storage controller 214 is integrated on a common substrate with processor 212. In one example, storage controller 214 separate chip from processor 212, and can be integrated in a multichip package (MCP) with processor 212.

Memory 220 includes controller 240, which represents a controller at the memory or storage device to process and service commands from storage controller 214. In one example, controller 240 represents a controller for a memory device. In one example, controller 240 represents a controller for a memory module. Memory 220 includes 3D array 222. In one example, 3D array 222 includes NAND memory blocks. In one example, 3D array 222 includes QLC NAND memory blocks.

As illustrated, bitlines (BL) intersect the planes of the layers of wordlines (WL). As an example, each wordline WL[0:(N−1)] is a layer. There can be P bitlines (BL[0:(P−1)]). In one example, 3D array 222 is also divided into subblocks through SGD[0:(M−1)], which divide each wordline into separate segments within a layer or within a plane of wordlines. Alternatively, SGS can be subdivided to provide subblocks. In such a configuration, whereas SGS is shown to apply to multiple SGD lines, there could be multiple SGS lines to a single SGD line. SRC represents a common source.

Channel 250 represents a vertical channel of the 3D array. The channel refers to a vertical stack of bitcells that can be charged through a channel connector. In one example, the channels couple to the bitline. It will be understood that there can be spatial dependencies in the stable Vt state of a channel. For example, the flow of charge carriers in the channel can be different at the different ends of the channels. Thus, blocks with specific wordlines may show worse degradation than others. The operation of controller 240 to mitigate read disturb due to stable Vt in the channel can be set by thresholds and operation that mitigates the most sensitive of the wordlines.

Each label, WL[0], WL[1], SGD[0], and so forth, indicates a select signal provided by control logic of decode logic 224, or a select signal provided by control logic of sense/output logic 226. In one example, decode logic 224 includes selection logic to select each of the signal lines illustrated. In one example, sense/output logic 226 enables the sensing of the contents of bitcells of 3D array 222, for either a read operation or to write a value back to the array. The output can be for a read operation to send data back to host 210. A write operation would include writing to a buffer to apply the values to the array.

It will be understood that a signal line in 3D array 222 is a wire or trace or other conductor that provides charge from a driver to the various elements or components. A driver circuit decode logic 224 provides the charge to charge up each signal line to the desired voltage for the desired operation. Each signal line can have an associated voltage level associated with certain operations. For example, each wordline can have a select voltage and a deselect voltage to indicate, respectively, wordlines that are selected for an operation and wordlines that are not selected for an operation.

In 3D array 222, it will be understood that the length of the wordlines can be substantial. In one example, the number of layers of wordlines is on the order of tens or dozens of wordlines (e.g., N=28, 32, 36, 72, 100, 144, or more). In one example, the number of subblocks is on the order of ones or tens (e.g., M=8, 76, or more). Typically, the number of bitlines in 3D array 222 will be on the order of hundreds to thousands (e.g., P=2K). Thus, in one example, each bitline is relatively short compared to the length of the wordlines.

Figure 3:
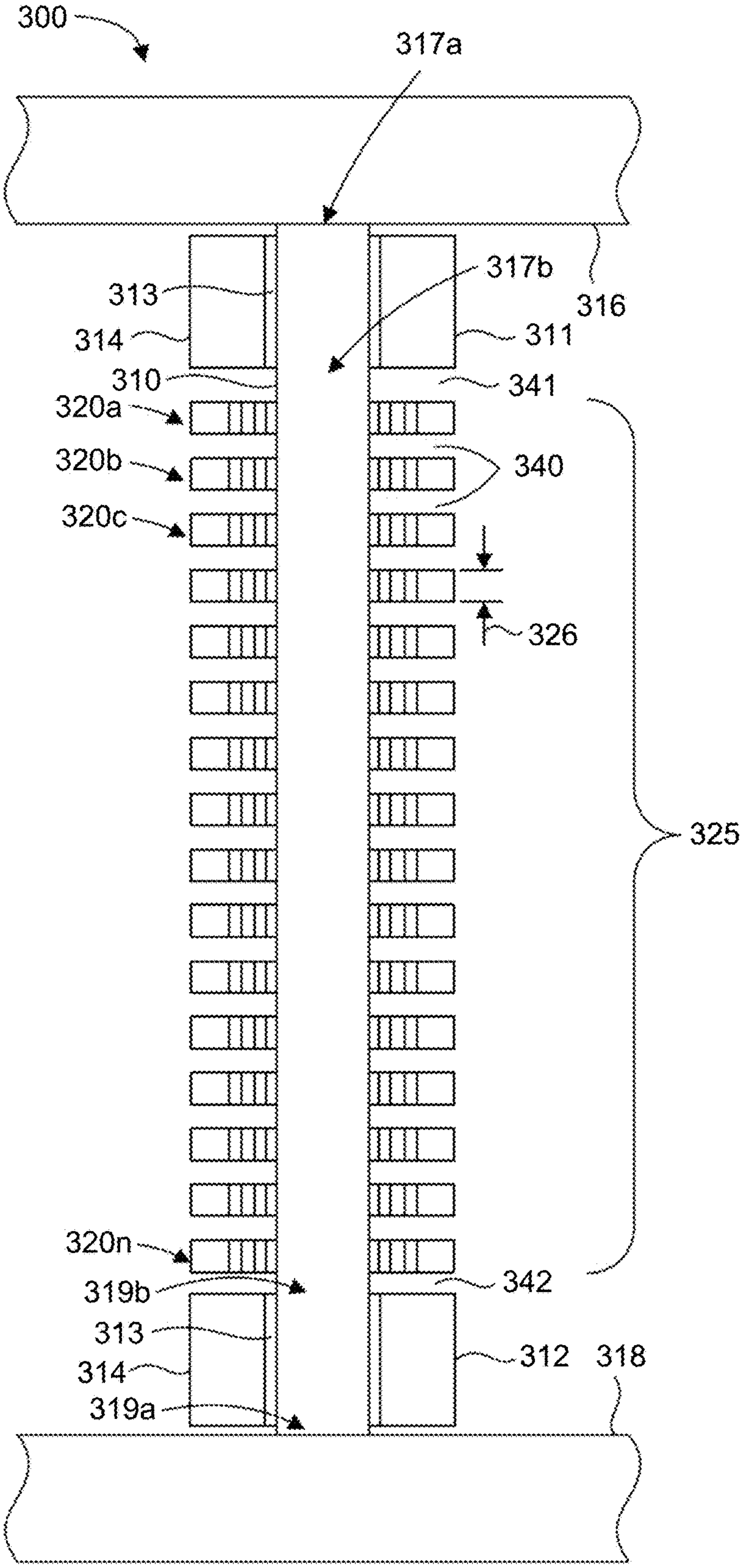
FIG. 3 is a diagram illustrating an abstracted representation of a portion of a solid-state memory component, according to one example.

FIG. 3 shows an abstracted representation of a portion of a solid-state memory component 300, according to one example. In general, the portion of the solid-state memory component includes a memory hole 310 and memory cells 320*a-n* (i.e., a string 325 of memory cells, such as a NAND string) located adjacent to the memory hole 310. Memory hole 310 may also be referred to as a "pillar" in some embodiments. Any suitable number of memory cells can be included. The memory hole 310 can act as a channel region for the memory cells 320*a-n*, which can be coupled in series. For example, during operation of one or more of the memory cells 320*a-n* of the string, a channel can be formed in the memory hole 310. The memory hole 310 and the string of memory cells 320*a-n* can be oriented vertically, such as in a three-dimensional memory array. For example, memory cell 320*a* is located at a vertical level (e.g., near the top of the memory array) that is above a vertical level (e.g., near the bottom of the memory array) at which memory cell 320*n* is located. Generally, memory cells 320*a-n* can have any suitable structure. A simplified memory cell structure is provided for context and by way of an example. Therefore, it should be recognized that suitable memory cell structures can vary from the memory cell structure shown in FIG. 3.

Figure 4:
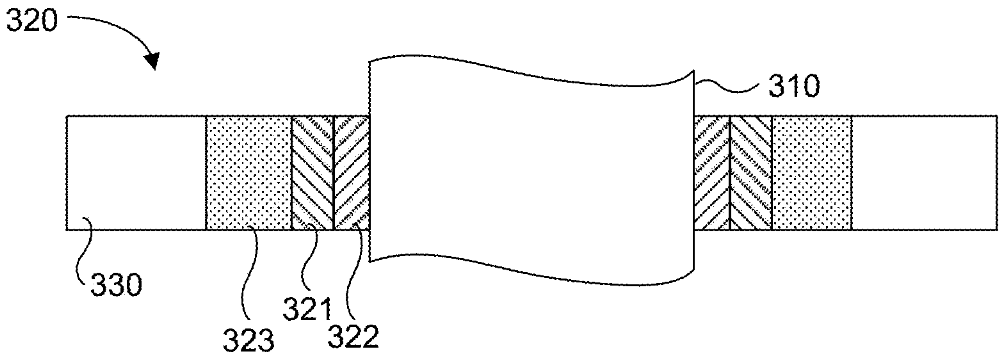
FIG. 4 is a diagram illustrating a simplified structure of a memory cell implemented in the solid-state memory component of FIG. 3.

Each memory cell 320*a-n* in this example can have a charge-storage structure (e.g., that may be a conductive floating gate, a dielectric charge trap, etc.). For example, as shown in FIG. 4, which illustrates a cross-section side view, memory hole 310 and a representative memory cell 320, the memory cell 320 can have a charge-storage structure 321. Each memory cell 320*a-n* can also have a tunnel dielectric interposed between its charge-storage structure and memory hole 310. For example, the memory cell 320 can have a tunnel dielectric 313 interposed between the charge-storage structure 321 and the memory hole 310. In addition, each memory cell 320*a-n* can have a control gate (e.g., as a portion of or coupled to access lines, such as word lines). For example, the memory cell 320 can include a control gate 330. Each memory cell can have one or more dielectric materials or dielectric layers interposed between its charge-storage structure and the control gate. For example, the memory cell 320 can include dielectrics (layers) 323 interposed between the charge-storage structure 321 and the control gate 330 referred elsewhere in the text as inter-poly dielectric (IPD).

Each memory cell 320 may be a non-volatile memory cell and may have a charge-storage structure 321, such as a floating gate that may be a semiconductor (e.g., polysilicon), a charge trap layer that may be a dielectric film, etc. Non-limiting examples of dielectrics that are suitable for charge traps include silicon nitrides, high-dielectric constant (high-K) dielectrics, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$. Embodiments of floating-gate and charge trap cells are described and illustrated below.

With further reference to FIG. 3, a dielectric 340 (also called an isolation layer) may be interposed between successively adjacent memory cells 320*a-n* in string 325. For example, a dielectric 340 may be interposed between at least the charge-storage structure 321, dielectrics 323, and the control gates 330 of successively adjacent memory cells 320*a-n*. A dielectric 341 may be interposed between an end (e.g., between memory cell 320*a*) of the string 325 and the select gate 311, and a dielectric 342 may be interposed between an opposite end (e.g., between memory cell 320*n*) of the string 325 and the select gate 312, as shown in FIG. 4.

In some embodiments, where the charge-storage structure 321 is a charge trap, the tunnel dielectric 322, the charge-storage structure 321, and the dielectrics 323 can form a continuous structure that can be shared by (e.g., that may be common to) two or more of the memory cells 320*a-n*. For example, such a structure can be shared by or common to all of the memory cells 320*a-n*.

Each of the memory cells 320*a-n* can have a thickness (e.g., a channel length) 326. For example, memory cells 320*a-n* can have the same channel length regardless of where in string 325 the memory cells are located. In some embodiments, at least one channel length of a memory cell can be different from another channel length of another memory cell.

Each memory cell 320*a-n* of the string 325 can be coupled in series with and can be between a select gate (e.g., a drain select gate) 311 adjacent to (e.g., in contact with) the memory hole 310 and a select gate (e.g., a source select gate) 312 adjacent to (e.g., in contact with) the memory hole 310. For a functional memory hole, the memory hole 310 is electrically coupled to a data line (e.g., a bit line 316), indicated at 317*a* and 317*b*. Thus, the select gate 311 can selectively couple string 325 to the data line (e.g., the bit line 316). In addition, for a functional memory hole, the memory hole 310 is electrically coupled to a source line 318, indicated at 319*a* and 319*b*. Thus, the select gate 312 can selectively couple string 325 to the source line 318. For example, the select gate 311 can be coupled in series with memory cell 320*a*, and the select gate 312 can be coupled in series with memory cell 320*n*. The select gates 311 and 312 can each include a gate dielectric 313 adjacent to (e.g., in contact with) memory hole 310 and a control gate 314 adjacent to (e.g., in contact with) a corresponding gate dielectric 313.

Figure 5:
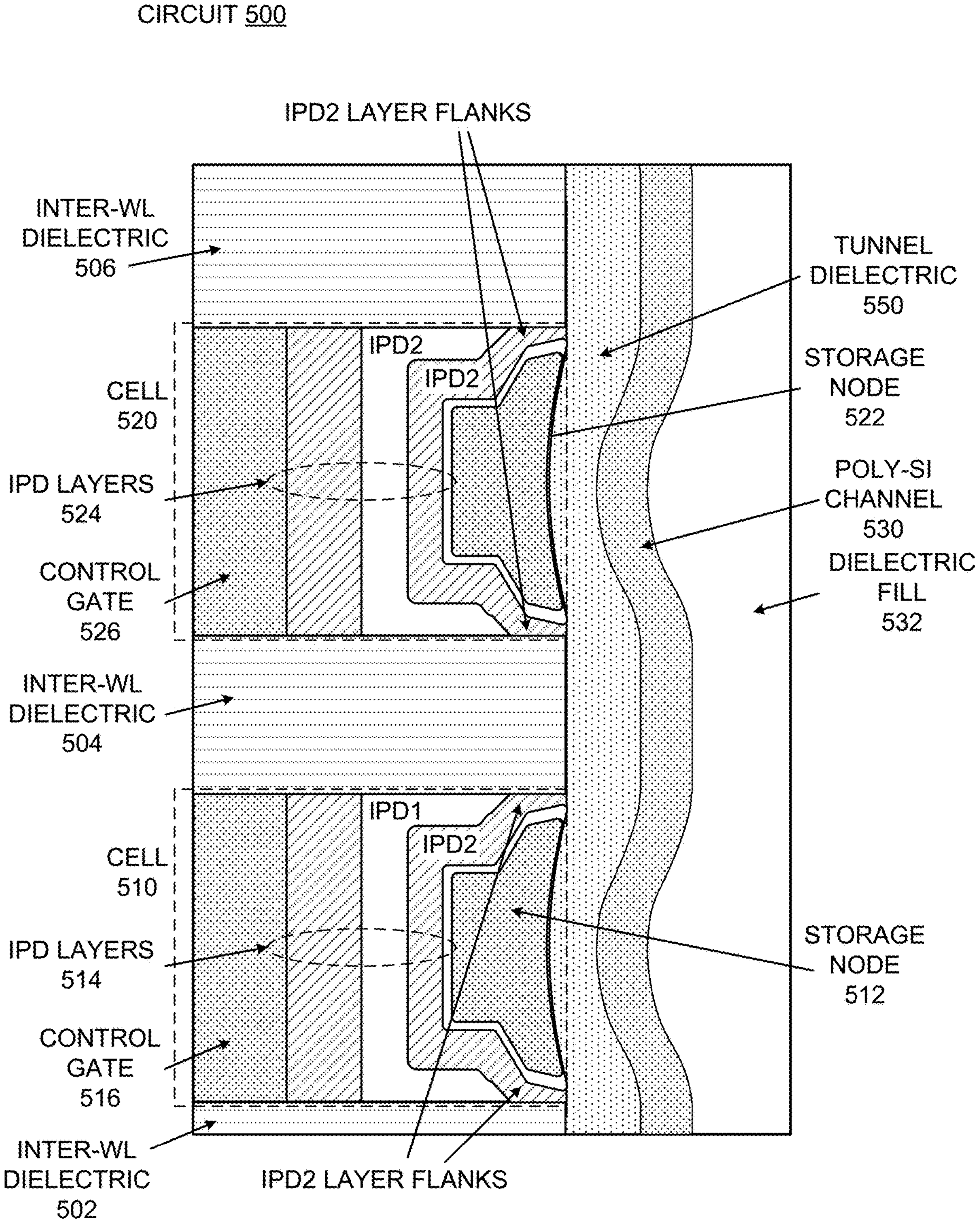
FIG. 5 is a diagram representing a cross-section view of a portion of a vertical channel in a 3D memory structure, according to one embodiment.

FIG. 5 shows a circuit 500 that represents a portion of a vertical channel in a 3D memory structure, such as a 3D NAND array that is fabricated using existing processes. Circuit 500 is not necessarily to scale and illustrates non-limiting example of features rather than providing an exact representation of features. Also, the shape of some of the cell structures are simplified for illustrative purposes.

Circuit 500 depicts two memory cells, cell 510 and cell 520 and three inter-wordline dielectric layers 502, 504, and 506 (which may also be called isolation layers). Although circuit 500 is not necessarily to scale, the isolation layers between the cells are generally thinner than the cells themselves. The cells illustrate one example of a memory cell structure, with semiconductor indicated as storage node 512 and storage node 522, respectively. Storage node 512 is separated from control gate polysilicon by one or more IPD (inter-poly dielectric) layers 514. The conductor layer polysilicon is a layer of conductor to control electrical access to the storage node. The conductor layer polysilicon for storage node 512 is represented as control gate 516. Likewise, storage node 522 is separated from conductor layer polysilicon by one or more IPD layers 524, represented as control gate 526. The number of IPD layer and the structure of those layers is not important for circuit 500, as long as the storage node is electrically isolated from the conductor layer.

In one example, circuit 500 includes channel conductor 530 with a dielectric fill 532. 3D NAND typically uses polycrystalline (polysilicon) material for channel 530, such as but not limited to polycrystalline silicon. In one example, channel 530 may be p-type or n-type doped polysilicon.

Some prominent features of cells 510 and 520 include the profile shapes of the storage nodes 512 and 522, and the profile shapes of the IPD layers adjacent to the storage nodes, which have flanks (e.g., for IPD2). Also, the profiles of the tunnel dielectric 550 and the Poly-Si channel 530 have waviness and are not (substantially) flat. These profiles have substantial curvatures that eventually contribute to cell dimensional non-uniformities.

FIGS. 3 and 4 illustrate examples of ideal structures in which memory holes have perfectly straight sidewalls (i.e., constant diameter) and the thicknesses of dielectric layers remain the same from the top to the bottom of the memory holes. The aspect ratios (height to width or hole depth to hole diameter ratio) are reduced in FIG. 3 for illustrative purposes and clarity—the aspect ratio in actual devices is greater, such as shown in some of the following Figures.

Generally, it is not possible or practical to form memory holes with high aspect ratios that have perfectly straight sidewalls. Rather, the memory holes have a slight amount of taper, with the diameter at the top of the memory hole being slightly greater than the diameter at the bottom.

Furthermore, under a current floating-gate (FG) cell formation process described and illustrated in U.S. Pat. No. 10,622,450 the post memory hole etch involves isolating the inter-poly nitride part of blocking dielectric (IPD) and the floating gate/storage node such as. An example of a representative cross-section of an FG cell is shown in FIG. 5. This is a key difference between Floating gate (FG) and Charge-Trap (CTF) 3D NAND cell architectures. The ability to achieve floating-gate enables excellent device reliability (e.g., charge retention) over the CTF cell technology.

The proposed design and process flow of the FG cell architecture takes advantage of the excellent reliability performance of FG cell while also eliminating the sacrificial processing steps done inside of the memory holes. Thus, this approach of FG cell formation accomplishes the same structural isolation of cell films by accessing the cell layers (IPD, storage node) from a series of block separation features instead of the memory holes. These block separation features are sometimes referred to as replacement features/replacement holes in the latter text. These replacement holes are used as access points to remove the inter-WL silicon nitride layers and therefore access the cell films from the backside of each memory hole. In so doing, the cell transistor critical features are preserved, including forming a discrete IPD2 silicon nitride for each cell, minimizing of the flank feature, and achieving a final trapezoidal floating gate/storage node shape. Eliminating sacrificial steps and/or doing the processing from the backside can have a systematic uniformity benefit by addressing potential processing limitations in performing processing inside of a minimum feature size channel hole, especially at the bottom of the hole on very high aspect ratio features where reaction-rate limited and/or transport-limited process kinetics for those layers may result in undesirable non-uniformity and where hole size reduction on future technologies may additionally exacerbate these effects.

Proposed approach has fewer processing steps done inside of memory hole and the only subtractive process step done inside of the hole for the proposed approach is the inter-wordline silicon nitride layers recess. This step has improved immunity of dimensional variation to a critical device feature, i.e., storage node thickness.

The process flow of the proposed FG cell formation is divided into three parts, referred to as in-memory hole processing (FIGS. 6*a*-6*j*, FIG. 7 flowchart 700), inter-wordline airgap processing (FIG. 8 flowchart 800, FIGS. 9-12), and back-side processing (FIGS. 13*a*-13*e*, flowchart 1400). In-memory hole processing portion of the FG cell formation is designed to be simple and enables tight uniformity of the deposited films inside of the memory hole. Back-side processing portion of the FG cell formation is where the storage node/floating gate is isolated.

Figures 6A, 6B, 6C, 6D, 6E:
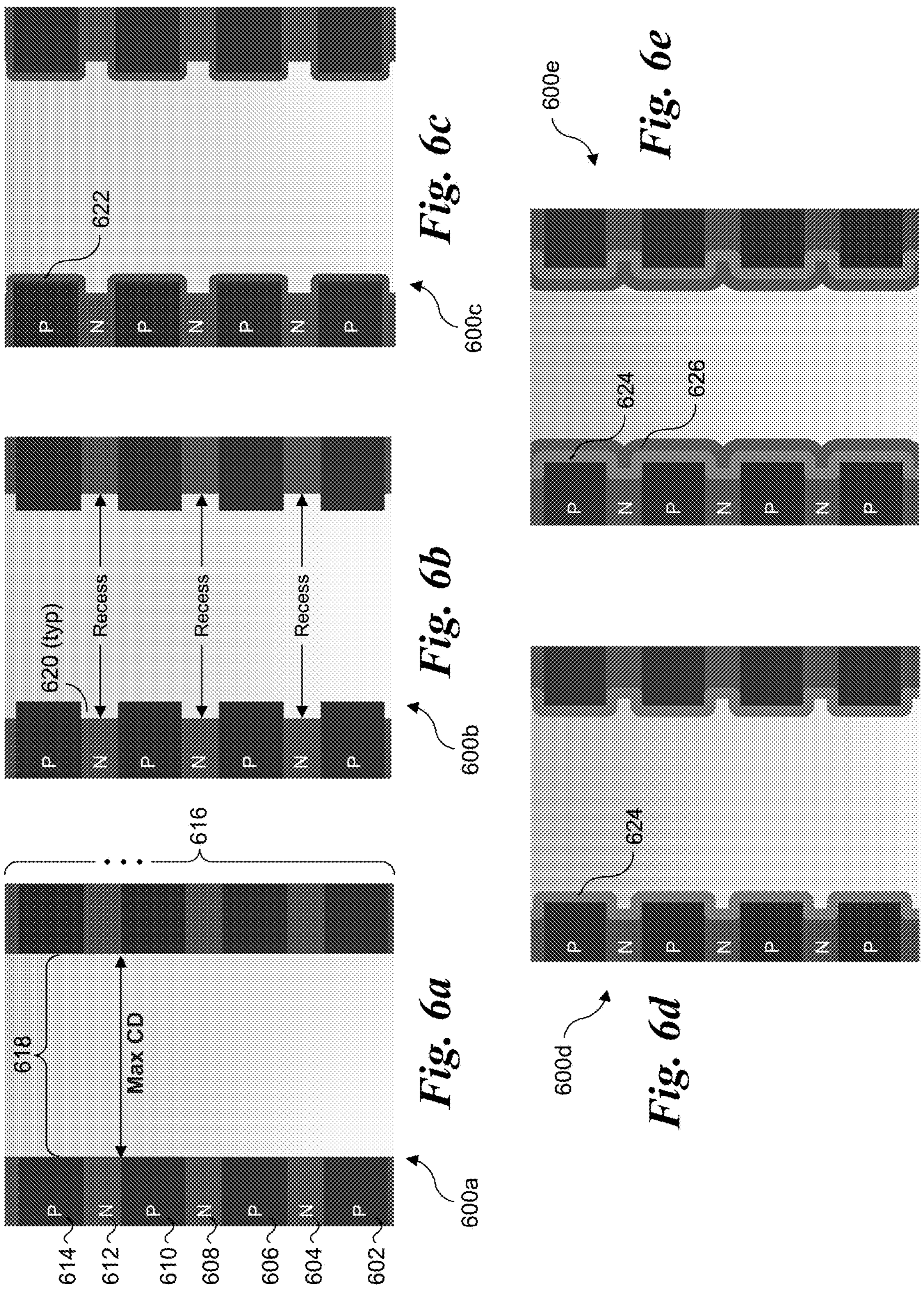
FIGS. 6*a*-6*j* show cross-section views of an NPNP stacked layer structure at respective states for floating gate cell in-memory hole processing, according to one embodiment.
Figure 6F:
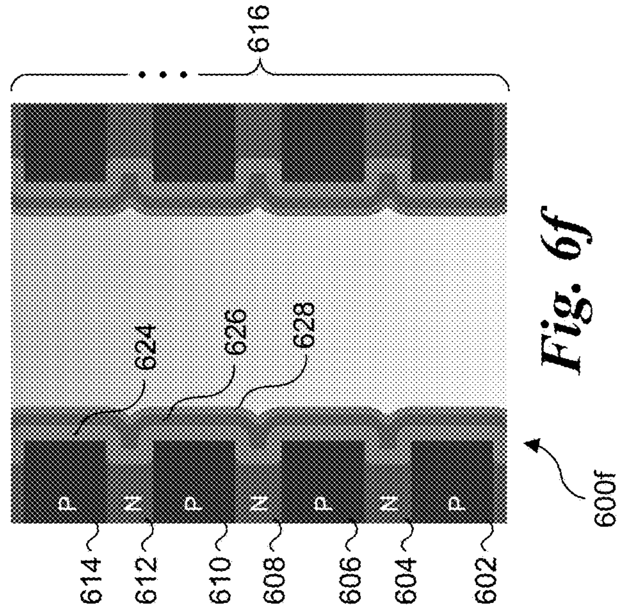
Figure 6G:
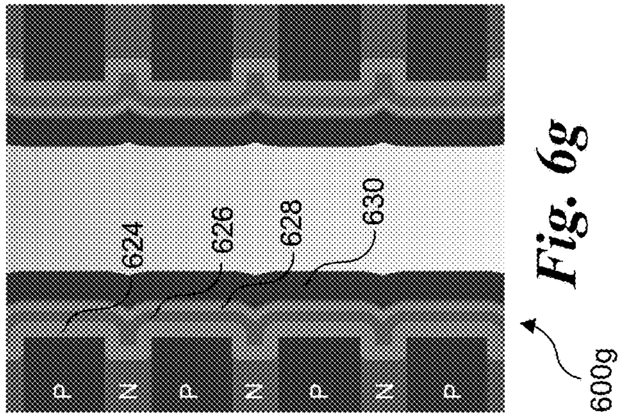
Figure 6H:
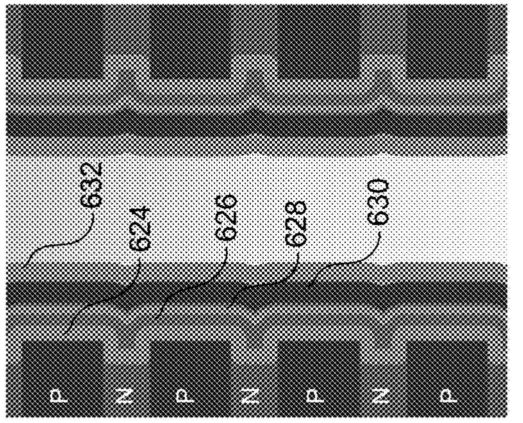
Figure 6I:
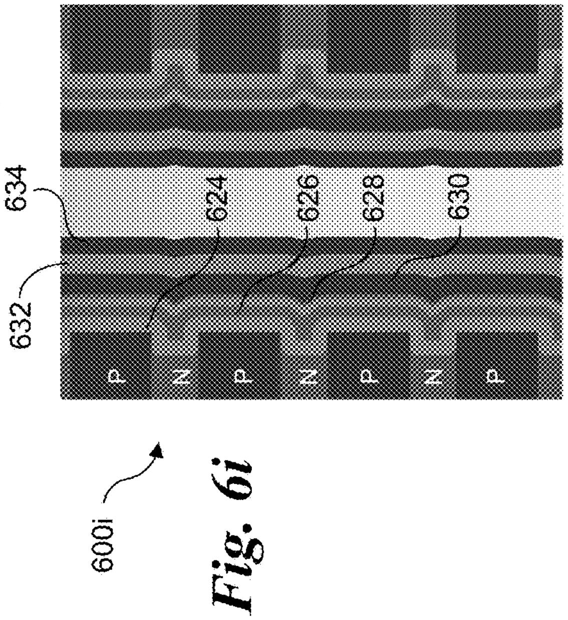
Figure 6J:
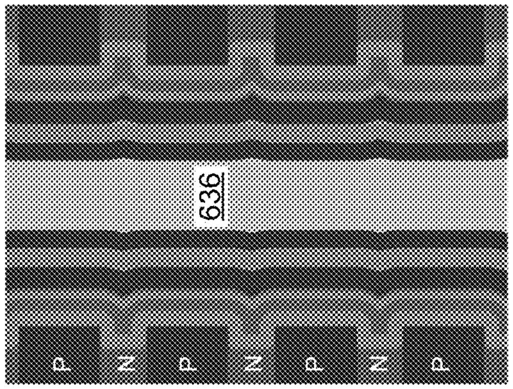
Figure 7:
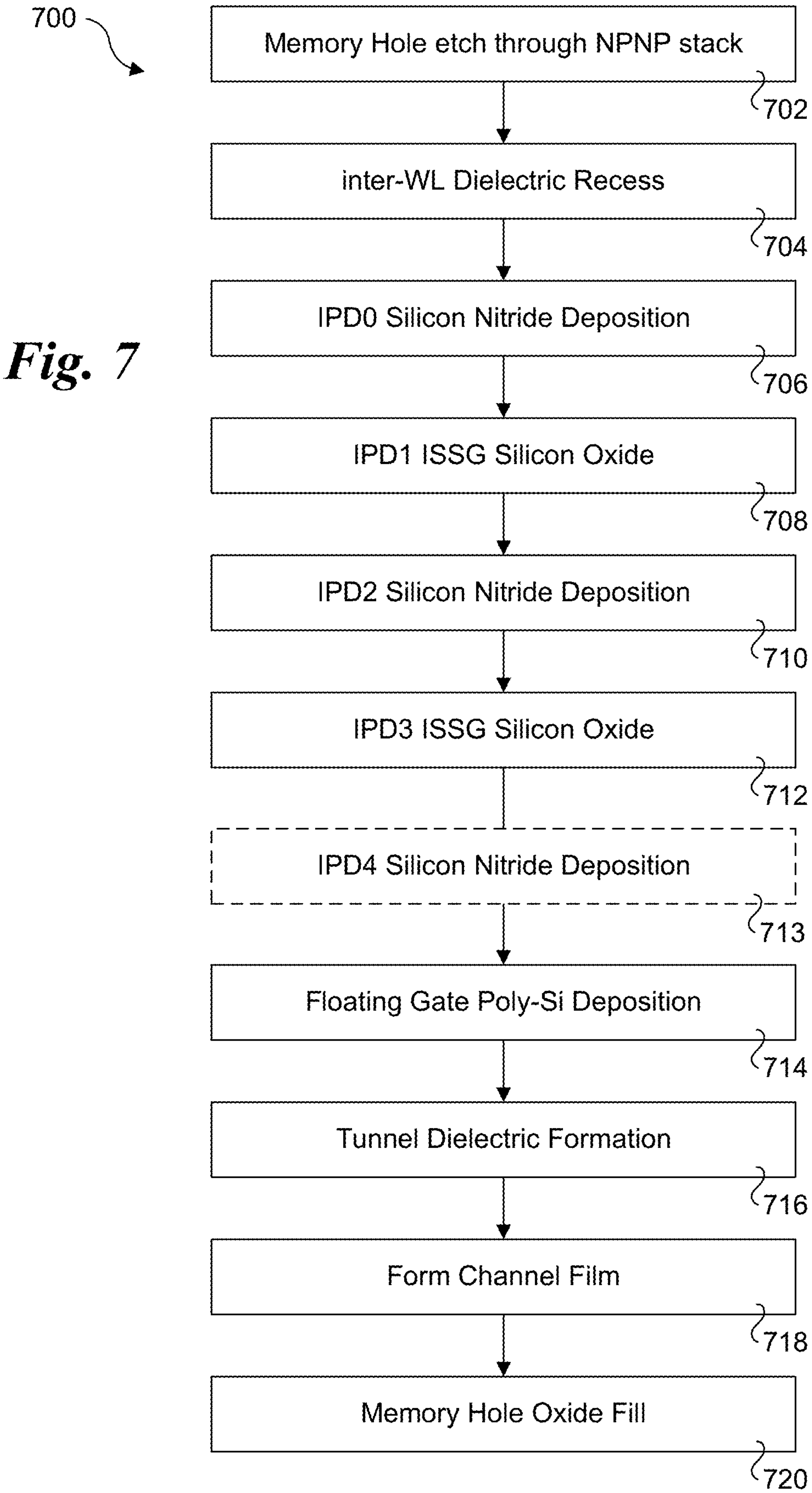
FIG. 7 is a flowchart illustrating operations performed during the FG cell in-memory hole processing of FIGS. 6*a*-6*j*, according to one embodiment.

FIGS. 6*a*-6*j* and the accompanying flowchart 700 in FIG. 7 illustrate a process flow for FG cell in-memory hole processing, according to one embodiment. The process flow begins in a block 702, wherein a memory hole etch through a layer stack of alternating silicon nitride (N) and polysilicon (P) layers is performed. Since there is no CGR (control gate recess) etch like in the conventional FG cell formation, the maximum memory hole diameter could be enlarged by ~2×CGR depth compared to conventional FG cell memory hole diameter. This enables the memory hole etch CD (critical dimension) and taper uniformity furthermore across the length of the high-AR layer stack.

In one exemplary and non-limiting embodiment, the silicon nitride (N) and poly-silicon (P) layers comprising of the high-AR layer stack illustrated herein is deposited using plasma enhanced chemical vapor deposition (PECVD). The polysilicon in NPNP layer stack is originally deposited as amorphous and crystallized at a later cell-formation step (i.e., high-temperature IPD layer formation). Therefore, the initial deposition of layer stack could be performed under deposition temperatures <550 C to maintain the amorphous nature of silicon as well as to reduce the overall film thermal stress during NPNP layer stack deposition. In one of embodiment, the silicon nitride layers deposition could result in tensile stress, whereas the silicon layers deposition could result in compressive stress. This may result in net reduction of overall wafer bow due to the layer stack stress compared to conventional FG cell layer stack which comprises of silicon oxide and polysilicon layers which could be both compressive in nature during deposition.

The memory hole etch occurs post layer stack deposition and is schematically illustrated in structure 600*a* in FIG. 6*a*, which shows a stacked layer structure comprising alternating silicon nitride (N) layers 604, 608, 612 interposed between polysilicon (P) layers 602, 606, 610, and 614. A pair of polysilicon and silicon nitride layers forms a memory layer, and the stacked layer structure comprises a deck 616 of memory layers. It should be noted that, in practice, the number of memory layers would be substantially more than the number of memory layers illustrated in the Figures herein, which are simplified for clarity and ease of explanation. A mask will be used to form the memory holes in the stacked layer structure, which may have patterns similar to those illustrated and described below. A maximum critical dimension (CD) corresponds to the diameter of a memory hole 618. In one exemplary and non-limiting embodiment the max CD is around 125 nm. Generally, the diameter of a memory hole may decrease with etch depth and the sidewall of the memory hole could be slightly tapered as a result. Memory hole etch may be performed using state-of-the art dry etching techniques utilized in 3D NAND memory industry.

After the memory holes/pillars are etched, as shown in a block 704 of flowchart 700 and as illustrated in cross-sectional schematic view 600*b* in FIG. 6*b*, a controlled recess 620 of the silicon nitride layers 604, 608, 612 is performed with a wet etch chemistry (ex. 2000:1 dilute HF) selective to the polysilicon layers. In one embodiment, the recess depth inside the silicon nitride layers is ~6 nm. This recess is a critical feature of the FG cell design which improves the cell structure uniformity as explained in the later sections of back-side processing.

Next, as shown in a block 706 of flowchart 700 and illustrated in semiconductor structure 600*c* in FIG. 6*c*, a base inter-poly dielectric (IPD0) comprising a silicon nitride film 622 is conformally formed/deposited over the sidewall profile of the memory hole. In one embodiment, IPD0 film is a part of the FG cell and thus, for optimum dielectric quality, it may be deposited using low pressure chemical vapor deposition at high temperature (i.e., >700 C). In one embodiment, the thickness of silicon nitride film 622 is approximately 3 nm.

Continuing at a block 708 of flowchart 700, an in-situ steam generation (ISSG) oxidation process is employed to form an IPD dielectric film (IPD1) comprising an silicon oxide film 624 that is thermally grown from the previous IPD0 silicon nitride film 622, as illustrated in semiconductor structure 600*d* of FIG. 6*d*. Thus, after IPD1 formation, the IPD0 will be converted to IPD1 via ISSG process. In one embodiment, the thickness of silicon oxide film 624 is approximately 6 nm.

In a block 710, a third IPD film (IPD2) comprising a second silicon nitride dielectric film 626 is formed/deposited over IPD1 624, as illustrated in semiconductor structure 600*e* of FIG. 6*e*. In one embodiment, the silicon nitride film 626 deposition is similar to that of IPD0 and the thickness of IPD2 626 is approximately 5 nm.

Next, in a block 712 of flowchart 700, an ISSG oxidation process is employed to form a fourth IPD film (IPD3) comprising an silicon oxide film 628 that is formed by partially oxidizing IPD2 silicon nitride film 626, as illustrated in semiconductor structure 600*f* of FIG. 6*f* similar to that of IPD1. In one embodiment, the thickness of silicon oxide film 628 is approximately 3.5 nm.

Continuing at a block 714, a floating gate (FG) comprising a polysilicon film 630 is formed via deposition over silicon oxide film 628, as illustrated in semiconductor structure 600*g* of FIG. 6*g*. In one embodiment, the thickness of poly-Si film 630 is approximately 12 nm.

As illustrated in semiconductor structure 600*h* of FIG. 6*h* and shown in a block 716 of flowchart 700, a tunnel dielectric 632 is formed over poly-Si film 630. This dielectric film may be formed by oxidizing partially the FG polysilicon film. Therefore, in one embodiment, tunnel dielectric 632 comprises a silicon oxide film having a thickness of approximately 7 nm and the resulting floating gate polysilicon thickness is approximately 8 nm post tunnel dielectric growth.

As shown in a block 718, after tunnel dielectric is formed, the process flow continues with the deposition of a thin channel film 634 over tunnel dielectric 632, as illustrated as illustrated in semiconductor structure 600*i* of FIG. 6*i*. In one embodiment, channel film 634 comprises a polysilicon film having a thickness of approximately 7 nm. This channel is optimized for high electron mobility and low grain boundary traps. The remaining core of the memory holes are then filled with a silicon oxide 636, as shown in a block 720 and illustrated in semiconductor structure 600*j* of FIG. 6*j*. This completes the FG cell in-memory hole processing.

As shown in an optional block 713, in some embodiments an IPD4 film deposition process may be performed to form a second silicon nitride film between the IPD3 dielectric and the FG polysilicon materials that are added in block 712 and 714 discussed above. In one embodiment the IPD4 silicon nitride could have a thickness of approximately 2 nm. This optional step is not separately shown in FIGS. 6*a*-6*j* and is solely added for device reliability perspective to be used when deemed necessary.

The next set of operations in FG cell formation is referred to as the back-side cell formation wherein the cell films deposited in the previous steps are isolated to form isolated FG cells. But first, we need to be able to access the memory holes from the back-side in order to isolate cell films and complete the cell formation. This is facilitated by an inter-wordline airgap formation process using operations described in flowchart 800 of FIG. 8 and illustrated in FIGS. 9, 10, 11 and 12. Thus, the proposed FG cell design utilizes the forward-looking array architecture for FG cell (e.g., inter-wordline airgap) to enable the back-side processing portion of the FG cell formation.

Figure 9:
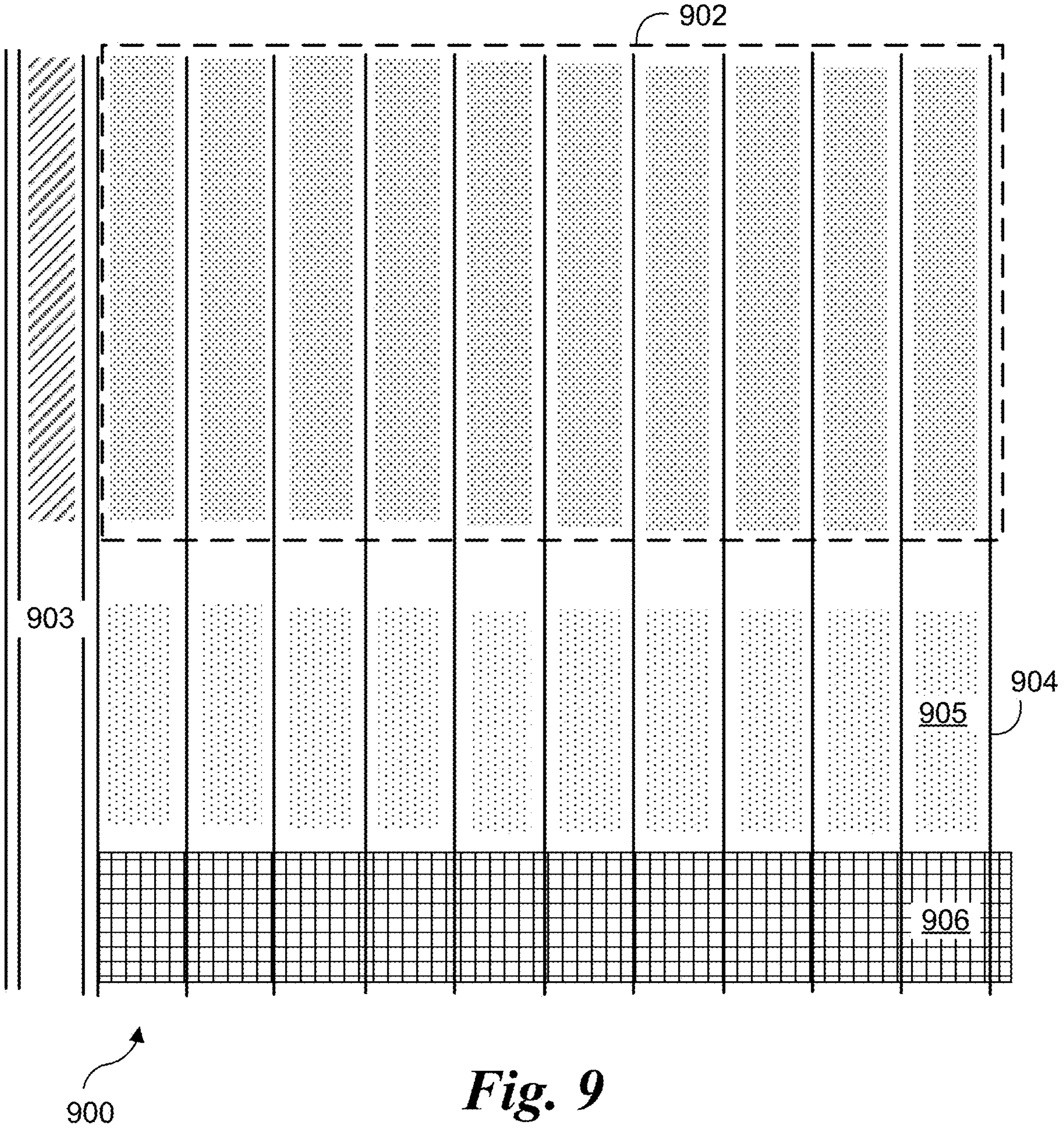
FIGS. 9 to 12 are illustrative, partial top views of the layout of an example of a 3D FG NAND array/periphery regions according to an embodiment.
Figure 10:
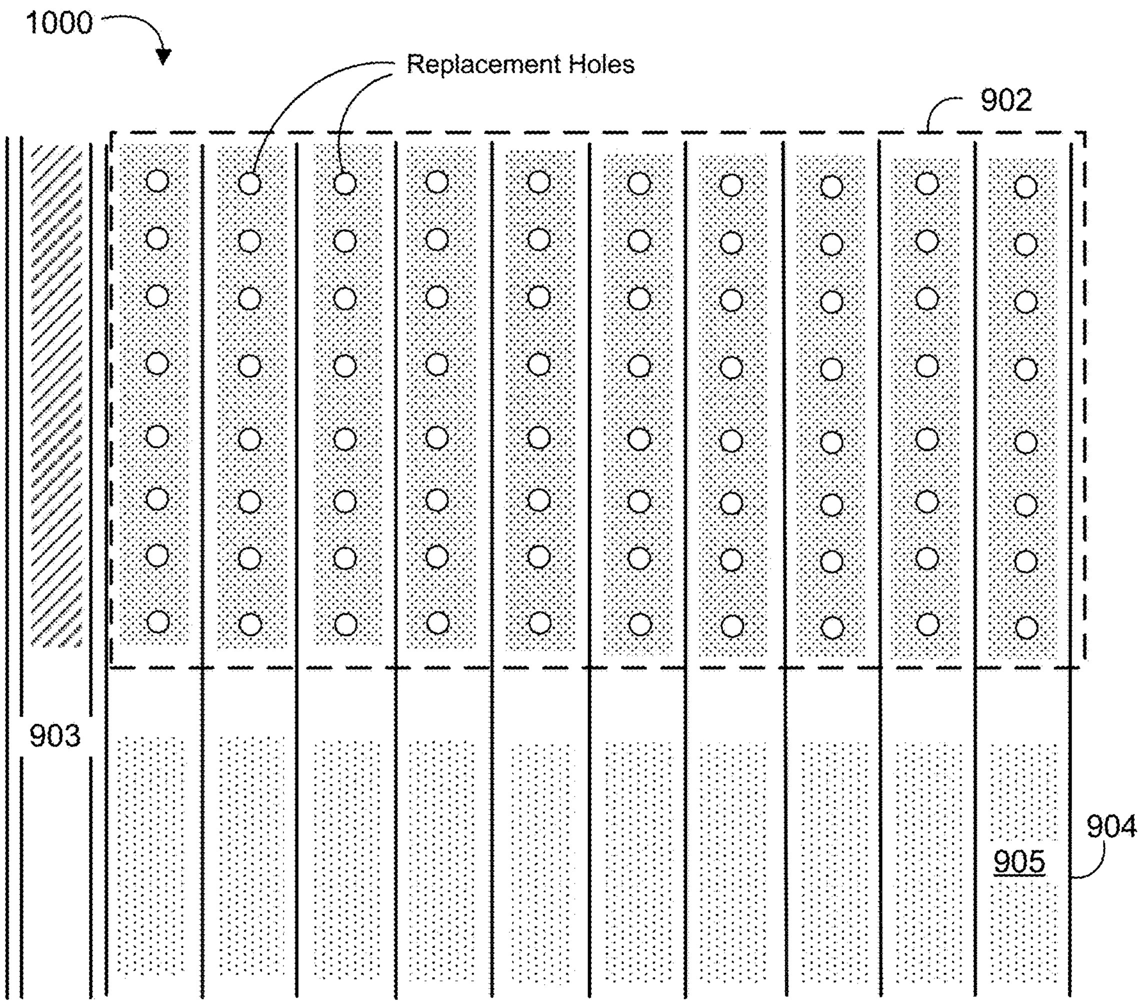

FIG. 9 shows a top-down layout view of a typical FG NAND memory highlighting the array (active memory holes/devices 902) region and periphery regions (contact circuitry 903, 904, 905, 906). As shown in FIG. 10, a series of replacement holes are defined inside of the array only without disrupting the periphery regions by means of photolithography and dry etch similar to that of the memory holes described earlier. In one embodiment previously claimed, the spacing (B in FIG. 11) between replacement holes may be approximately 1.5-2 um, and the diameter may be approximately 0.2 um (A in FIG. 11). These replacement holes are used as access points which provide access to the silicon nitride layers across the entire height of the layer stack. Next, a selective wet chemistry (i.e., Phosphoric acid at 85 C) is used to exhume all of the layer silicon nitride layers between polysilicon control gates selectively stopping the etch on IPD1 silicon oxide dielectric film. After exhuming the silicon nitride layers, an inter-wordline airgap is formed. Thus, formation of inter-wordline airgap allows the access to individual memory holes in the array.

Figure 8:
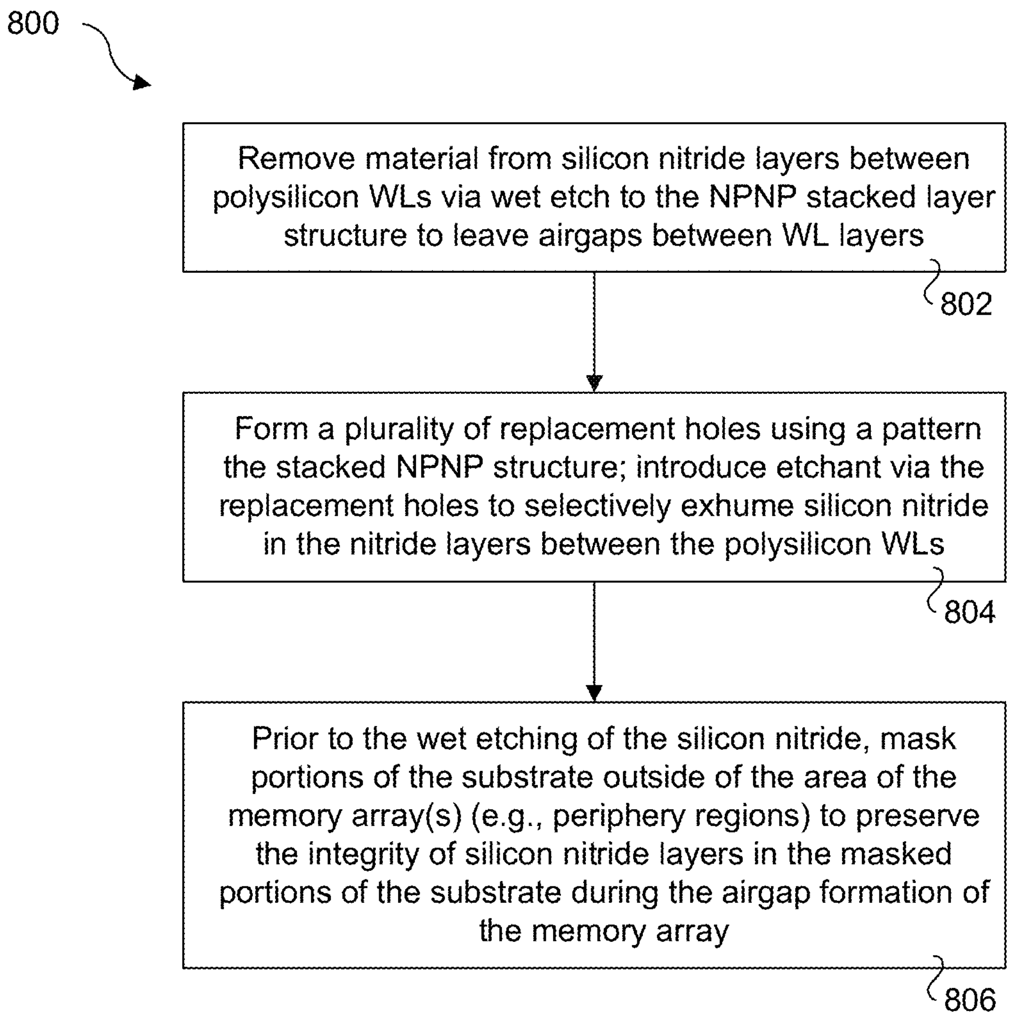
FIG. 8 is a flowchart illustrating operations for performing a process for exhuming silicon nitride material in silicon nitride layers, according to one embodiment.
Figures 13A, 13B, 13C, 13D, 13E:
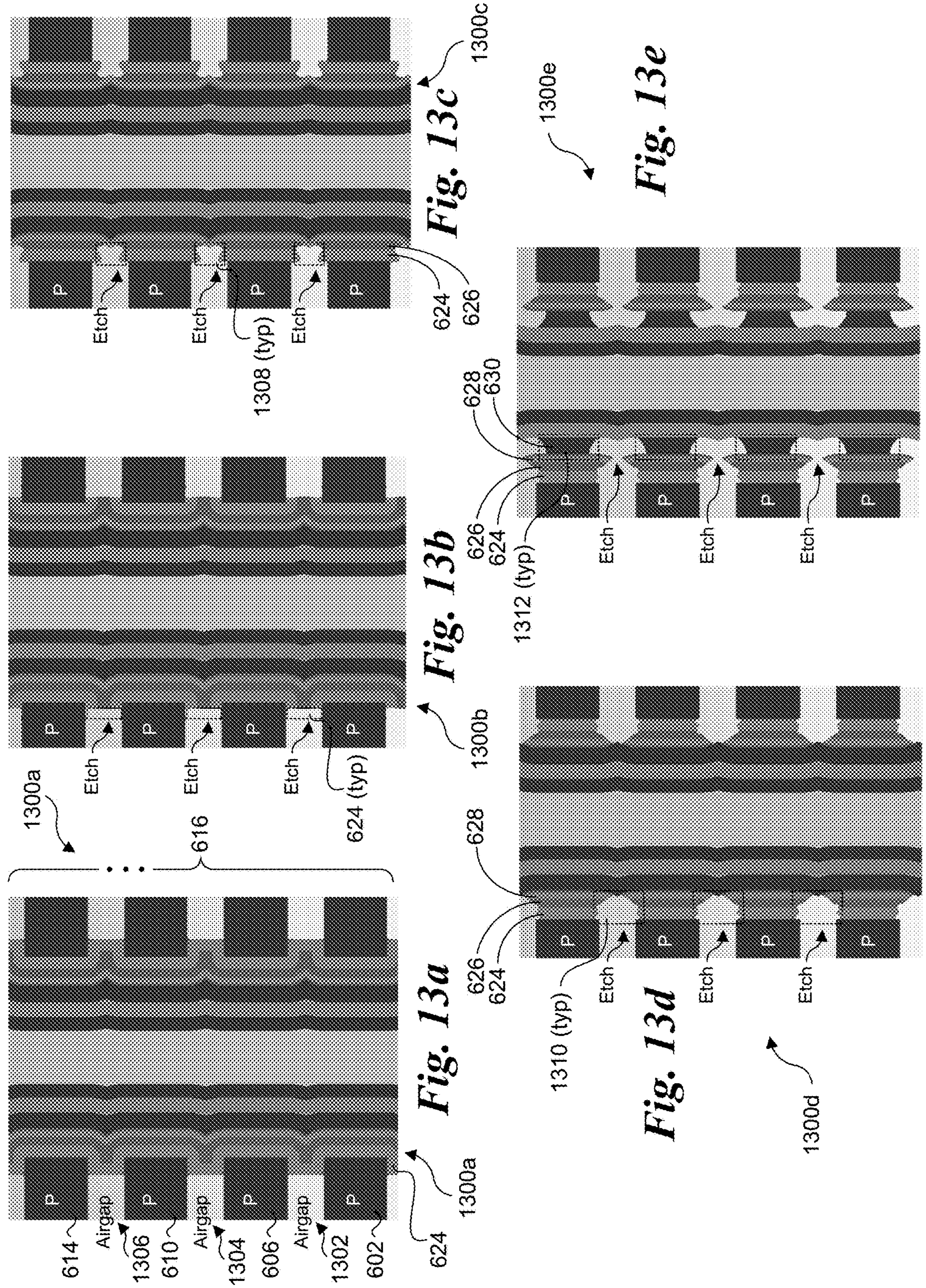
FIGS. 13*a*-13*e* show cross-section views of an NPNP stacked layer structure at respective states for an FG cell—back-side isolation process, according to one embodiment.
Figure 14:
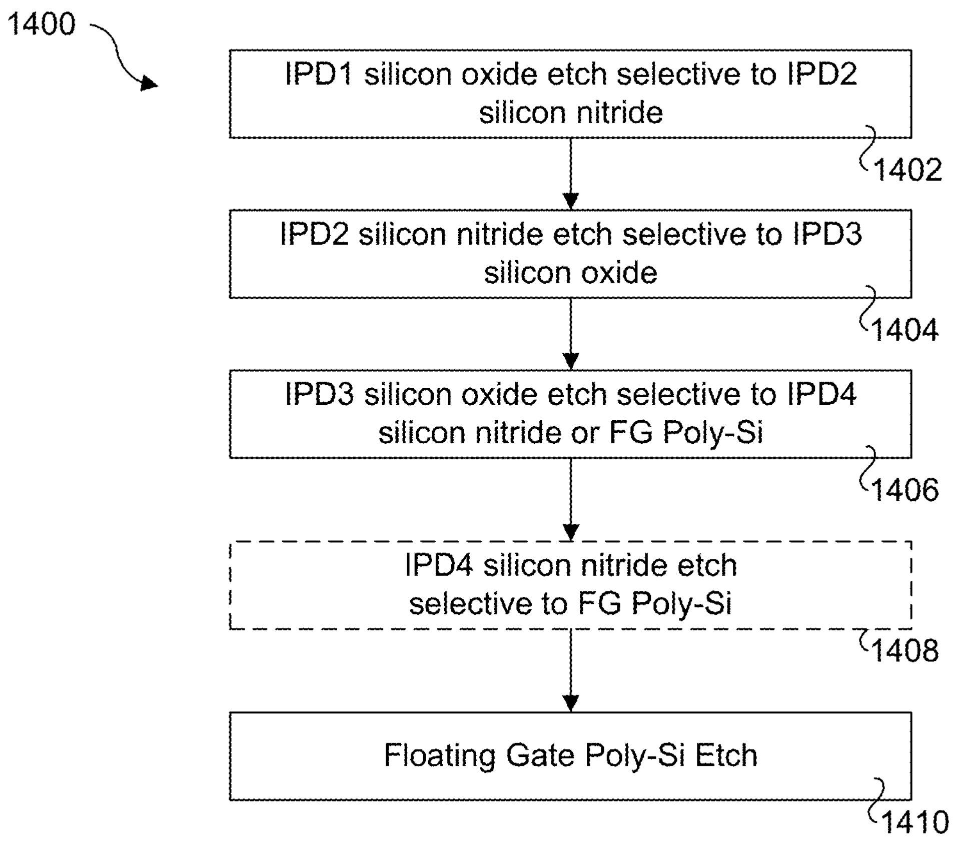
FIG. 14 is a flowchart illustrating operations performed during the FG cell—back-side isolation process of FIGS. 13*a*-13*e*, according to one embodiment.

FIG. 8 shows a flowchart 800 illustrating operations performed during inter-wordline airgap formation process that remove silicon nitride layers from the layer stack to leave an airgap in an area between the wordline layers. The process begins in a block 802 by removing material from the silicon nitride layers between polysilicon WLs via wet etch applied to the NPNP stacked layer structure to leave an airgap in selective areas between the wordlines. As shown in a block 804, in some embodiments exhuming silicon nitride layers may include forming a plurality of replacement holes in the NPNP stacked layer structure at a frequency that allows for complete etch of silicon nitride. Following formation of the replacement holes, the etchant used to exhume the silicon nitride is introduced into the replacement holes and spreads (via wet etch) throughout the silicon nitride layers, stopping at silicon oxide film 624, as shown in FIG. 13*a* and discussed below. In this embodiment, IPD1 silicon oxide film 624 operates as an etch-stop layer (ESL). In some embodiments, prior to the wet etching of the silicon nitride, the process may include masking portions of the substrate outside of the area of the memory array(s) (e.g., periphery regions) to preserve the integrity of silicon nitride layers in the masked portions of the semiconductor structure during the airgap formation of the memory array, as shown in a block 806.

To avoid non-array (i.e., periphery region contacts) disruption, (e.g., for circuits outside the array area), some embodiments constrain the airgaps (e.g., the removal of the silicon nitride material) to the array area (i.e., active region where 3D NAND FG cells are formed). Some embodiments provide replacement holes to exhume the silicon nitride via etching isotropically from all directions. After airgap formation, these replacement holes may be pinched off so that the subsequent steps in the processing of dies are not impacted. A voided dielectric deposition fill may be utilized to preserve the void between the wordlines and seal the replacement holes to maintain voids between the wordlines. This is followed by planarization of the surface sealing the access areas for subsequent processing steps.

FIG. 9 shows top-down view of layout of an embodiment of an example of a 3D memory array die 900 which includes an array 902 of 3D NAND strings (i.e., several thousands of 3D strings) together with additional circuitry outside of an area of the array 902. For example, circuitry including connections to the circuit under array 903, 904 may be provided outside of array 902, and WL contacts 905 may be provided outside array 902. Selective masking technique may be utilized to provide minimal or no disruption/impact to non-array/periphery regions 903, 904, 905, 906 of the 3D memory array die 900. For example, some embodiments may utilize spin-on-carbon type of coating (e.g., a high-volume manufacturable coating) to mask the periphery regions during the silicon nitride layers exhume to form the inter-wordline airgap only within the area of the array 902.

Figure 11:
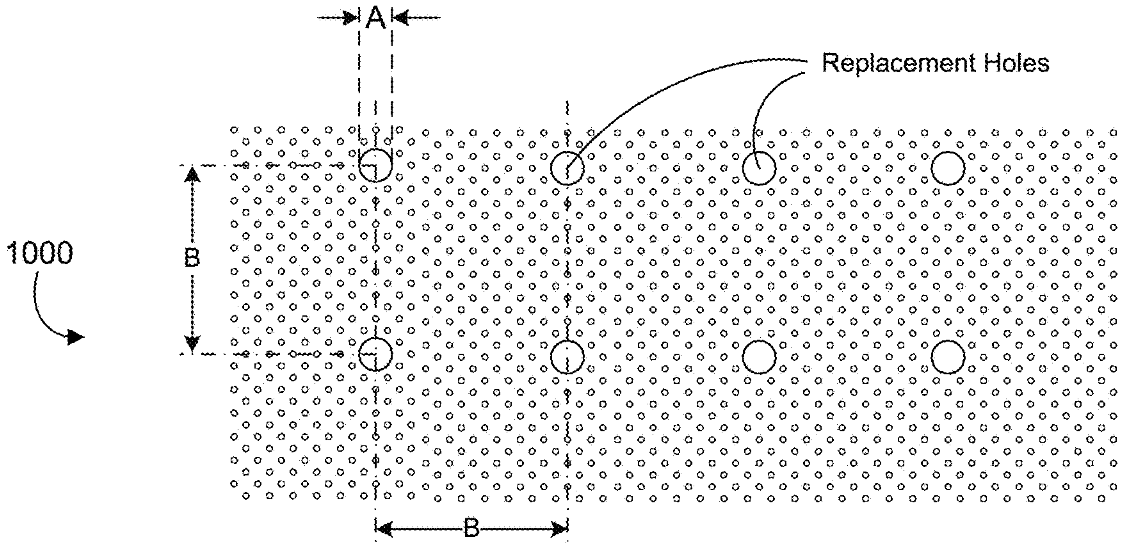
Figure 12:
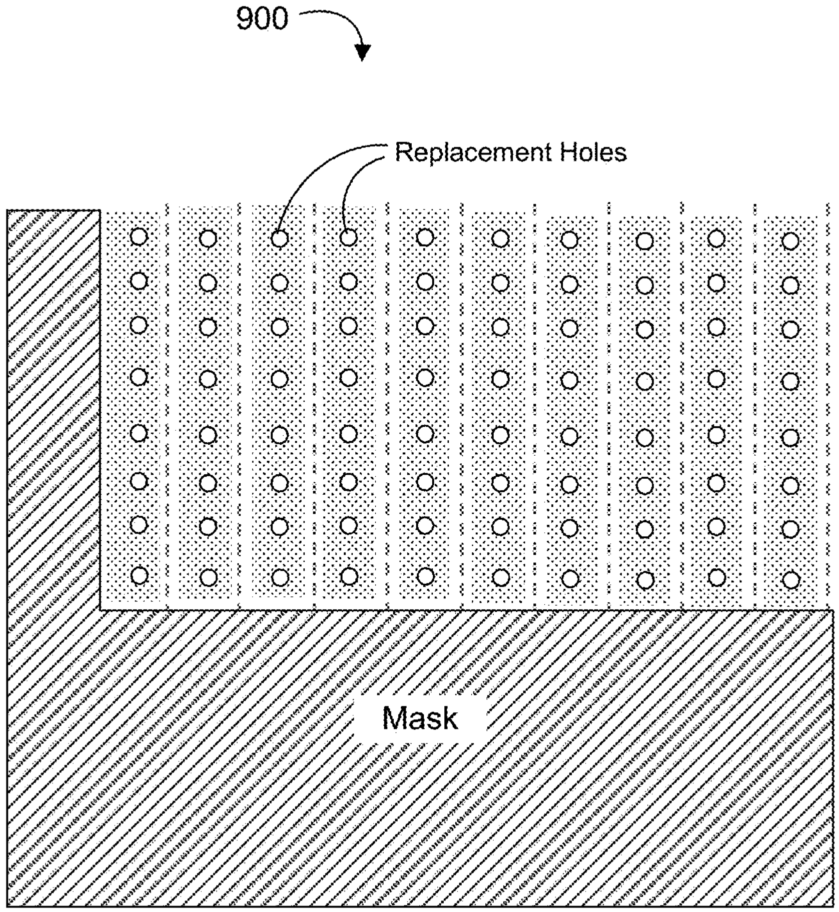

FIGS. 10, 11, and 12 illustrate an embodiment of a process 1000, that may be utilized with other processes herein to keep the layer silicon nitride exhume away from the periphery region of a 3D memory die (e.g., the non-array/periphery regions 903, 904, 905, and 906 in FIG. 9). Process 1000 may include any type of process which embodies etching the replacement features/replacement holes to silicon nitride layers across the height of the NPNP layer stack along with the periphery contact vias at the same time/step. This enables the replacements holes formation without adding additional process cost to manufacture. The replacement holes are designed in a way to maximize the silicon nitride exhume without eroding the IPD dielectric layers, as well as minimize the area overhead penalty that results with additional replacement holes in the array regions (see FIG. 11). The dimensions of replacement holes (diameter 'A') may be determined by the process capability of etching these features anisotropically through the entire height of the NPNP layer stack. The frequency of these replacement holes (distance 'B', replacement hole pitch) may be determined by the selectivity of etch chemistry of silicon nitride layers to in the memory hole array(s). Process 1000 may then include masking the non-array/periphery regions with a type of spin-on carbon coating that will be resistive to the chemistry used for silicon nitride layers exhume (see FIG. 12). Spin-on-carbon coating is used in state-of-the-art semiconductor manufacturing processes for a variety of applications, some of which include using as a sacrificial gap-fill in deep trenches, using as a type of hardmask for etching critical features, etc. After masking the periphery regions, the replacement holes are exposed to the etching solution in the array region for exhuming layer silicon nitride layers.

After masking the periphery regions and exposing the replacement holes in array regions, silicon nitride layers are then exhumed laterally from these replacement holes with a wet etch chemistry of phosphoric acid ($H_3PO_4$) which may exhibit up to ~500:1 etch selectivity to silicon dioxide ESL. In one embodiment, for every 500 nm exhume of silicon nitride layers, there may be—1 nm of ESL etch.

After inter-wordline airgap formation, with reference to flowchart 1400 of FIG. 14 and FIGS. 13*a*-13*e*, the process proceeds with back-side cell formation as follows. As illustrated in semiconductor structure 1300*a* of FIG. 13*a*, after exhuming the silicon nitride layers, to form inter-wordline airgap 1302, 1304, and 1306 between polysilicon layers 602, 606, 610, and 614, the cell film IPD1 is now exposed in every layer and every memory hole between the control gates from the backside of the memory hole. Hence the name back-side isolation for FG cell formation. Exemplary structures and corresponding operations for forming the airgaps are described earlier and previous embodiments.

Next, in a block 1402, a IPD1 film isolation from the backside is performed via a selective wet etch that is selective to wordline polysilicon and IPD2 silicon nitride materials. Recall from above, the IPD1 film comprises silicon oxide dielectric film 624, and thus a silicon oxide wet etch (1:100 dilute HF) is used to etch selectively etch the portions of silicon oxide film 624 adjacent to the airgaps, as illustrated in semiconductor structure 1300*b* of FIG. 13*b*. In one embodiment, the etching time is calibrated to remove only the portions of silicon oxide film 624 amounting to the thickness of IPD1 (i.e., 6 nm) and not completely etch away IPD1. Another boundary condition for this etching is to exhibit high selectivity and not remove the adjacent IPD2 silicon nitride film 626.

As shown in block 1404, after IPD1 isolation, the process flow continues to IPD2 film etch that is selective to both IPD1 and IPD3. This results in etching features 1308 in silicon nitride film 626, as illustrated in semiconductor structure 1300*c* of FIG. 13*c*. Similar to IPD1 isolation, in one embodiment, the inward depth of the IPD2 silicon nitride etch is approximately 4.5 nm which is tuned to isolate IPD2 precisely without over etching.

Next, in a block 1406, a IPD3 film isolation is performed similar to previous steps that is selective to IPD2 Silicon nitride. This IPD3 silicon oxide etch is used to selectively etch portions of silicon oxide film 628. It also etches portions of IPD1 silicon oxide film 624, resulting in the etch profiles 1310 shown in 1300*d* of FIG. 13*d*. In one embodiment the inward depth of the IPD3 etch is approximately 3.6 nm. Hence, the previously formed recess within layer silicon nitride layers (FIG. 6*b*) are extremely important to create additional margin for IPD1 silicon oxide etch during IPD3 silicon oxide etch. Otherwise, IPD1 would be further eroded during IPD3 isolation which shortens the length of remaining IPD1 on the control gate portions. This would be desired for optimum cell performance.

The FG cell—back-side isolation process is completed in a block 1410 in which the floating gate polysilicon etch is performed, with the result illustrated in semiconductor structure 1300*e* of FIG. 13*e*. As shown, etching of poly-Si film 630 form isolated storage nodes 1312 for every control gate.

If the optional IPD4 silicon nitride deposition is performed in block 713 of flowchart 700 above, and IPD4 silicon nitride etch selective to poly-Si is performed in a block 1408 prior to the FG polysilicon etch in block 1410. This is not separately shown in FIGS. 13*a*-13*e*, but the IPD4 silicon nitride layer/film is shown in FIG. 15 below.

Figure 15:
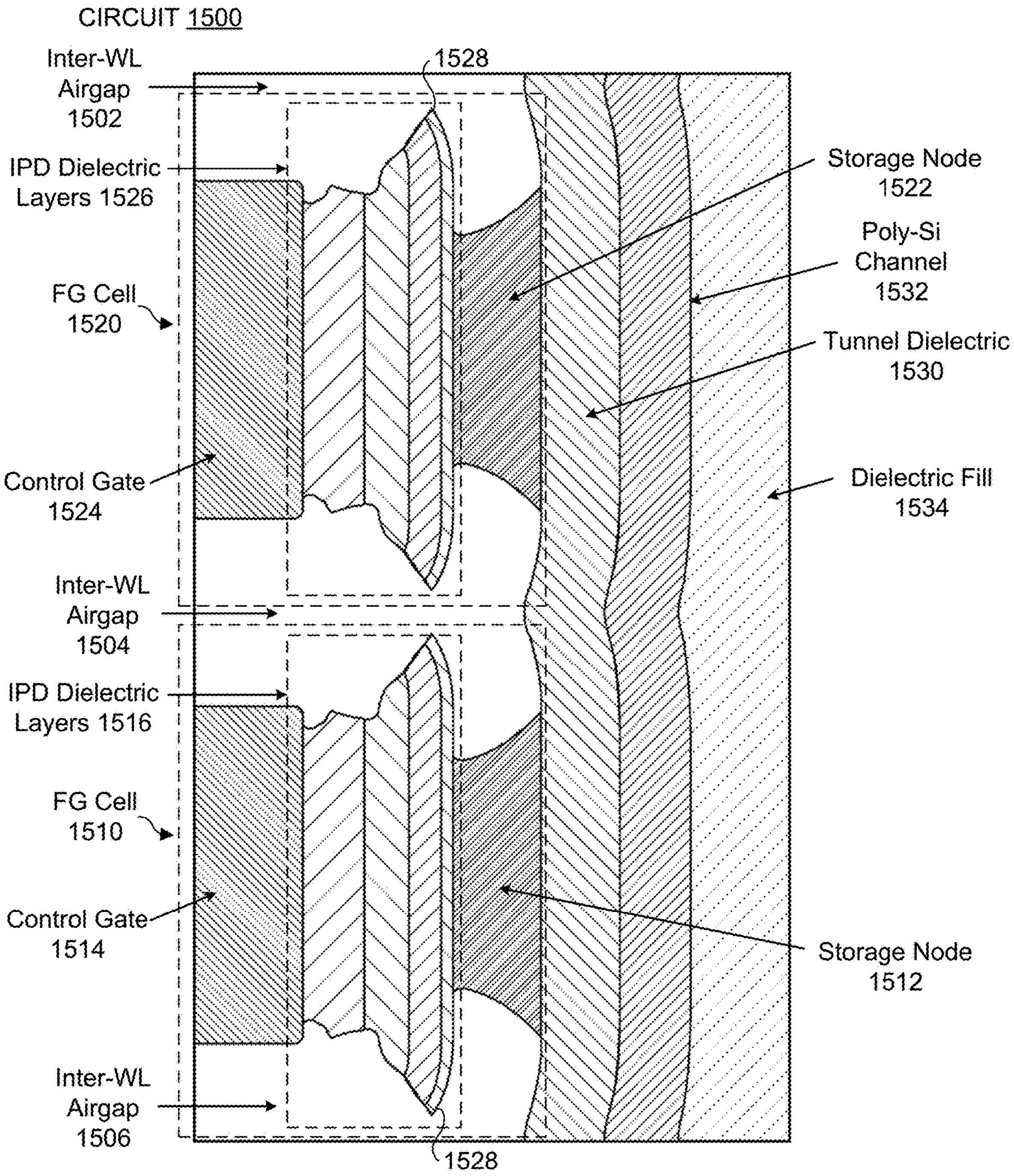
FIG. 15 is a diagram illustrating a cross-section view of a circuit including two FG cells, according to one embodiment.

FIG. 15 shows a cross-sectional schematic view of a circuit 1500 illustrating further details of a pair of FG cells 1510 and 1520 after FG cell formation. The FG cells are separated by inter-WL airgaps 1502, 1504, and 1506, which provide isolation functionality similar to isolation layers under the prior FG cells shown in FIG. 5 and discussed above. FG cell 1510 includes a storage node 1512, a control gate 1514, and IPD dielectric layers 1516 disposed there between. Similarly, FG cell 1520 includes a storage node 1522, a control gate 1524, and IPD dielectric layers 1526 disposed therebetween. In this embodiment IPD dielectric layers 1516 and 1526 include an IPD4 silicon nitride layer/film 1528. Circuit 1500 further shows a portion of a memory hole structure including a tunnel dielectric 1530, a poly-Si channel 1532, and dielectric fill 1534. The unique feature of FG cell formation includes the flat/straight profile of floating gate/storage nodes and channel compared to conventional FG cell (as shown in FIG. 5). Another unique feature of FG cell formation is the shape of IPD and floating gate layers which are approximately trapezoidal as a result of back-side isolation etch processes. Thus, the proposed cell eliminates the presence of a flank in IPD2 compared to conventional FG cell which boosts the programming capability of the cells (i.e., Program/Erase Vt window) of the NAND cells. Enhancing the P/E window will further enable the realization of 5 bit/cell (beyond QLC or 4 bit/cell technology) storage capability pushing the scaling for 3D NAND memory density.

Figure 16:
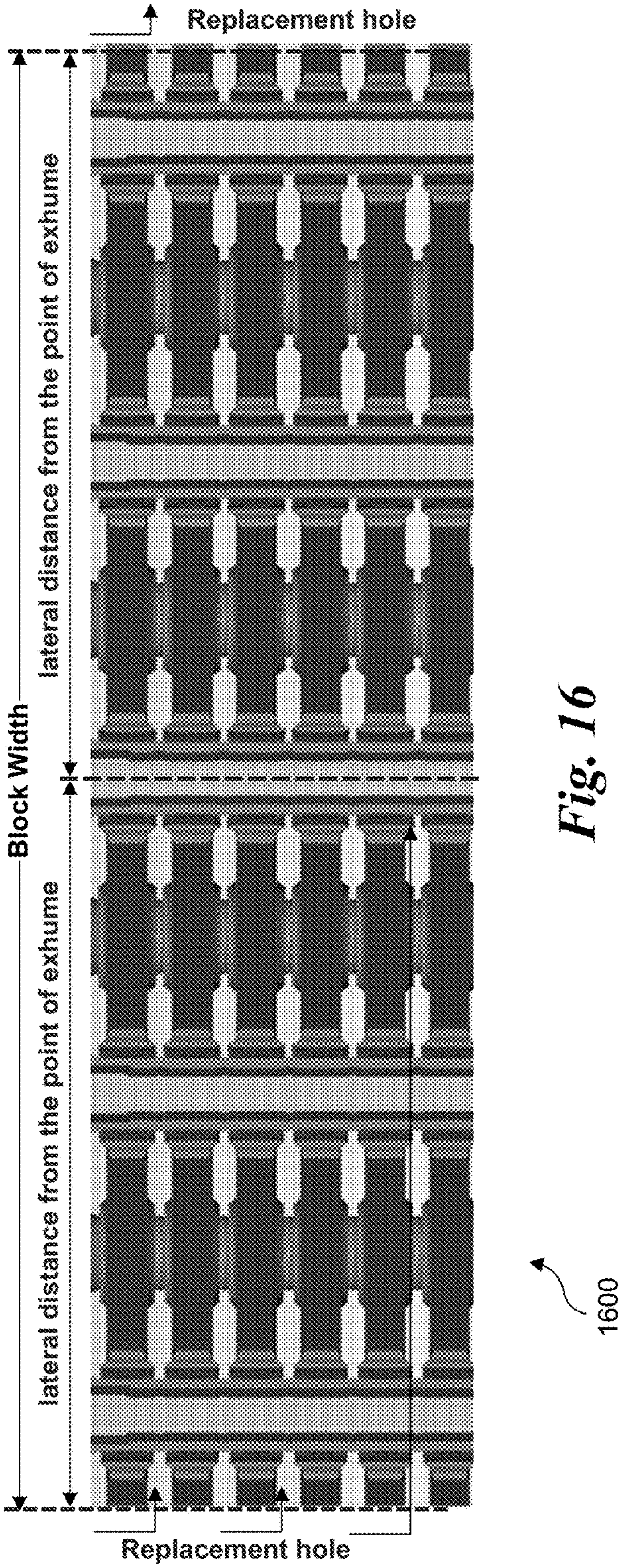
FIG. 16 is diagram illustrating a cross-section view of a circuit structure for five 3D NAND strings, according to one embodiment.

FIG. 16 shows a cross-section view of a circuit structure 1600 for five 3D NAND strings after the proposed FG cell formation is completed, according to one embodiment. In this example, the block width represents the horizontal distance between replacement holes (e.g., replacement hole pitch ‘B’ in FIG. 14), where the worst-case lateral distance from the point of exhume (e.g., the outer edge of the nearest replacement hole) is approximately half of the block width. In one embodiment, the block width is 1500 nm and the lateral distance from the point of resume is 700 nm.

As compared to a conventional FG NAND cell, embodiments of a NPNP stack-based FG cells with inter-wordline airgap integration may exhibit a small increase in area overhead to accommodate inter-wordline airgap access features or replacement holes. However, incorporating the inter-wordline airgap enables relaxed WL driver requirements (e.g., due to a 4×RC drop, CMOS circuit drivers that power the plurality of NAND arrays), and better 3D NAND cell scaling capability (e.g., Z-direction scaling of cell size which lead to increased density of memory transistors/mm2 with enhanced performance). The NPNP FG NAND cell architecture with inter-wordline airgap manufacturing process may involve creating the plurality of modified FG NAND cells as described above on an NPNP stack, and an isotropic etch process to remove the sacrificial inter-WL dielectric layers (i.e., silicon nitride) to achieve the airgaps between WLs. Ultimately, the ability to co-integrate inter-wordline airgap and FG cell architecture enables the FG cell scaling much more than the CTF cell without having to trade-off with device performance and/or reliability.

Figure 17A:
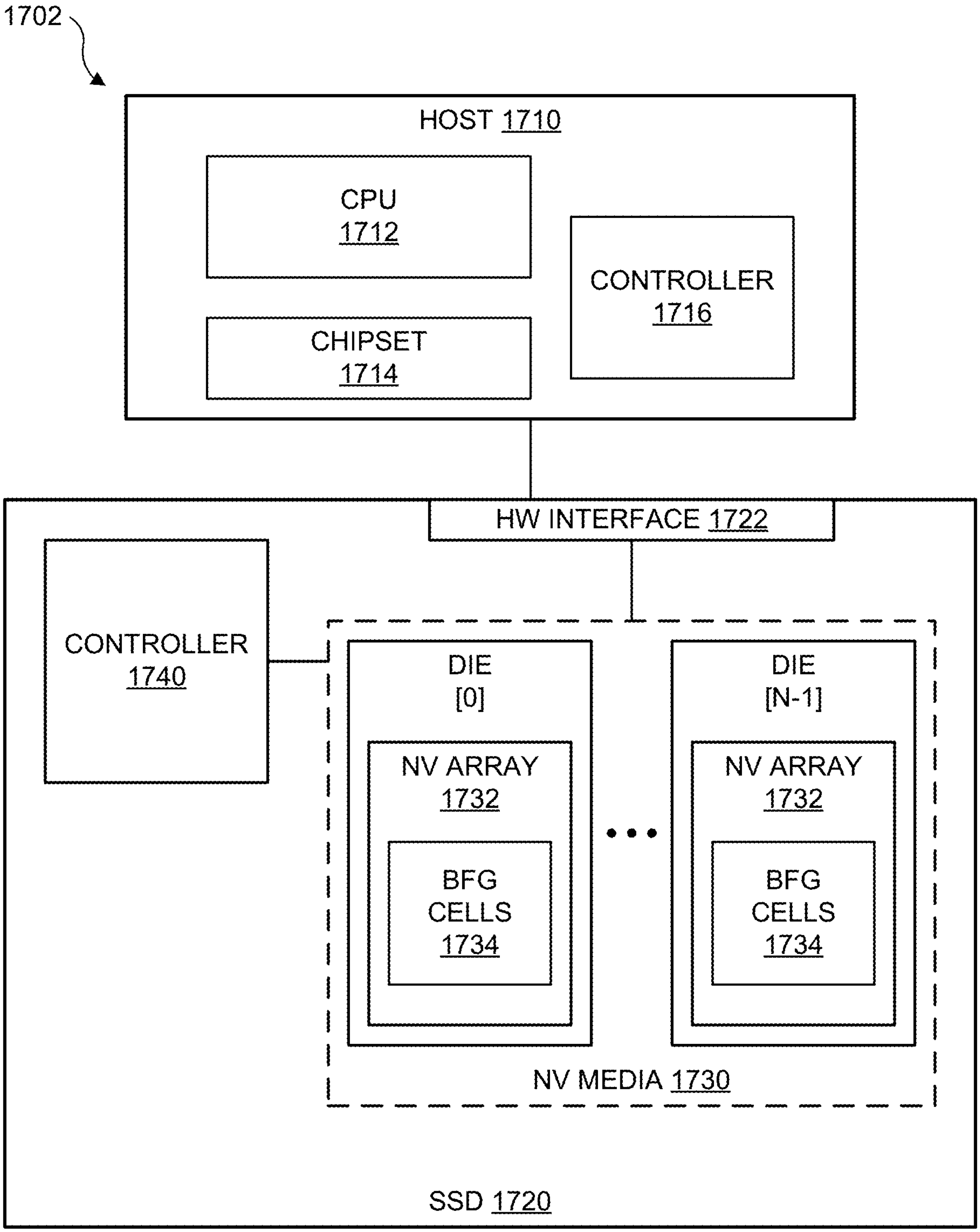
FIG. 17*a* is a block diagram of an example of a system with a hardware view of a solid-state drive (SSD) with a nonvolatile array having a vertical channel with conductive structures.
Figure 17B:
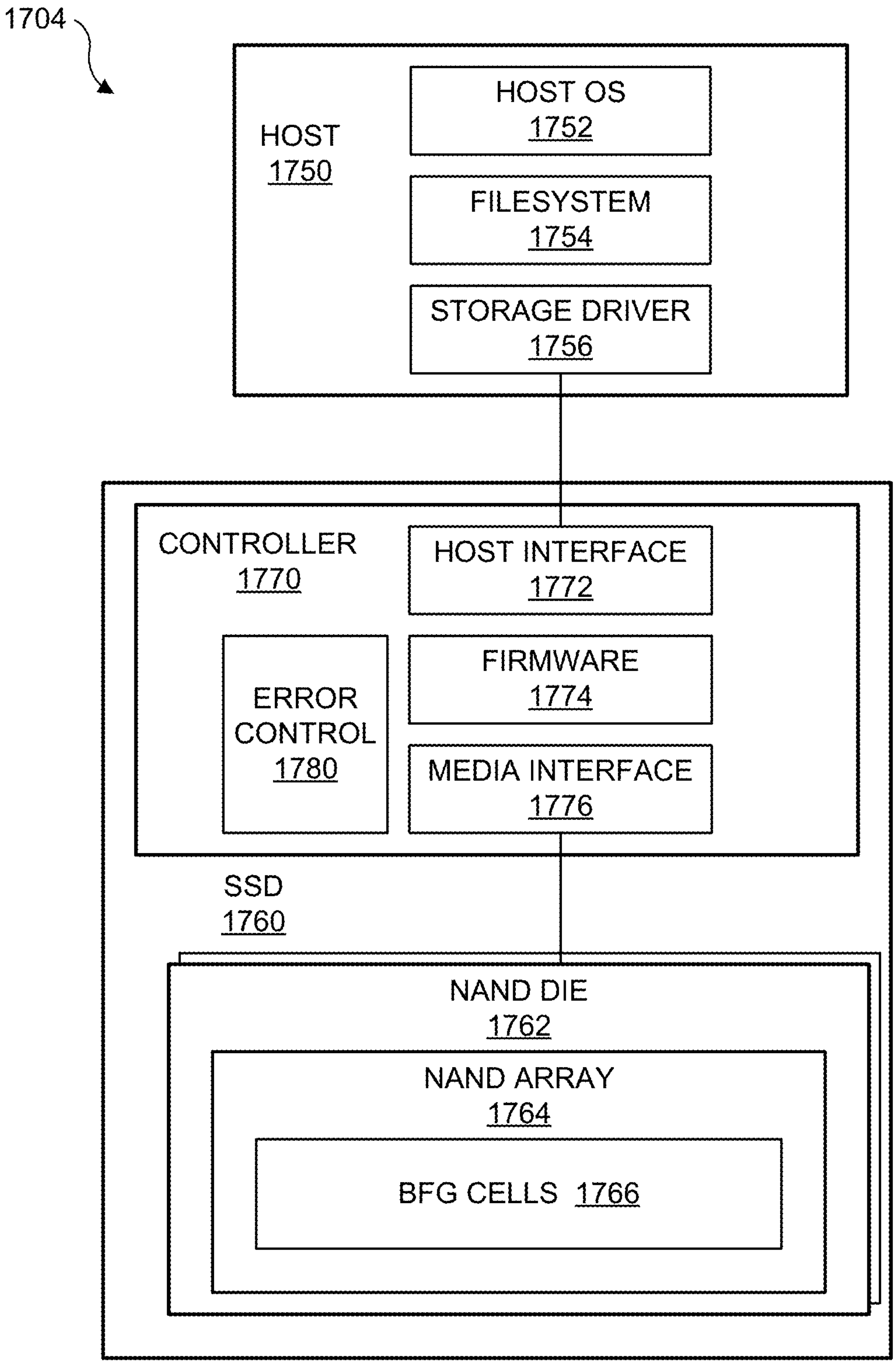
FIG. 17*b* is a block diagram of an example of a logical view of system with a solid-state drive (SSD) with a nonvolatile array having a vertical channel with conductive structures.

FIG. 17*a* is a block diagram of an example of a system with a hardware view of a solid-state drive (SSD) with a nonvolatile array having a vertical channel with conductive structures. System 1702 represents components of a nonvolatile storage system that could implement nonvolatile media having a vertical string with low resistance structures in accordance with any example described, such as system 100, or in accordance with the processing sequences described above.

System 1702 includes SSD 1720 coupled with host 1710. Host 1710 represents a host hardware platform that connects to SSD 1720. Host 1710 includes CPU (central processing unit) 1712 or another processor as a host processor or host processor device. CPU 1712 represents any host processor that generates requests to access data stored on SSD 1720, either to read the data or to write data to the storage. Such a processor can include a single or multicore processor, a primary processor for a computing device, a graphics processor, a peripheral processor, or a supplemental or auxiliary processor, or a combination. CPU 1712 can execute a host OS and other applications to cause the operation of system 1702.

Host 1710 includes chipset 1714, which represents hardware components that can be included in connecting between CPU 1712 and SSD 1720. For example, chipset 1714 can include interconnect circuits and logic to enable access to SSD 1720. Thus, host 1710 can include a hardware platform drive interconnect to couple SSD 1720 to host 1710. Host 1710 includes hardware to interconnect to the SSD. Likewise, SSD 1720 includes corresponding hardware to interconnect to host 1710.

Host 1710 includes controller 1716, which represents a storage controller or memory controller on the host side to control access to SSD 1720. In one example, controller 1716 is included in chipset 1714. In one example, controller 1716 is included in CPU 1712. Controller 1716 can be referred to as an NV memory controller to enable host 1710 to schedule and organize commands to SSD 1720 to read and write data.

SSD 1720 represents a solid-state drive or other storage system or module that includes nonvolatile (NV) media 1730 to store data. SSD 1720 includes HW (hardware) interface 1722, which represents hardware components to interface with host 1710. For example, HW interface 1722 can interface with one or more buses to implement a high-speed interface standard such as NVMe (nonvolatile memory express) or PCIe (peripheral component interconnect express).

In one example, SSD 1720 includes NV (nonvolatile) media 1730 as the primary storage for SSD 1720. In one example, NV media 1730 is or includes a block addressable memory technology, such as NAND (not AND) or NOR (not OR). In one example, NV media 1730 can include a non-volatile media that can be block addressable or byte addressable, which stores data based on a resistive state of the memory cell, or a phase of the memory cell. For example, NV media 1730 can be or include a 3D XPOINT™ (3DXP) memory or a storage array based on chalcogenide phase change material (e.g., chalcogenide glass). In one example, the NV media can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

In one example, NV media 1730 is implemented as multiple dies, illustrated as N dies, Die[0:{N−1}]. N can be any number of devices, and is often a binary number. SSD 1720 includes controller 1740 to control access to NV media 1730. Controller 1740 represents hardware and control logic within SSD 1720 to execute control over the media. Controller 1740 is internal to the nonvolatile storage device or module, and is separate from controller 1716 of host 1710.

The NV dies of NV media 1730 include NV array 1732, which represents a 3D array of storage cells based on the NV media. NV array 1732 includes arrays of BFC cells 1734 that are fabricated in accordance with the processes described and illustrated herein.

FIG. **17*b* is a block diagram of an example of a logical view of system with a solid-state drive (SSD) with a nonvolatile array having a vertical channel with conductive structures. System 1704 provides one example of a system in accordance with system 1702 of FIG. 17*a*. System 1704 illustrates the logical layers of the host and SSD of a hardware platform in accordance with system 1702. System 1704 can represent software and firmware components of an example of system 1702, as well as physical components. In one example, host 1750 provides one example of host 1710. In one example, SSD 1760 provides one example of SSD 1720**.

In one example, host 1750 includes host OS 1752, which represents a host operating system or software platform for the host. Host OS 1752 can include a platform on which applications, services, agents, and/or other software executes, and is executed by a processor. Filesystem 1754 represents control logic for controlling access to the NV media. Filesystem 1754 can manage what addresses or memory locations are used to store what data. There are numerous filesystems known, and filesystem 1754 can implement known filesystems or other proprietary systems. In one example, filesystem 1754 is part of host OS 1752.

Storage driver 1756 represents one or more system-level modules that control the hardware of host 1750. In one example, drivers 1756 include a software application to control the interface to SSD 1760, and thus control the hardware of SSD 1760. Storage driver 1756 can provide a communication interface between the host and the SSD.

Controller 1770 of SSD 1760 includes firmware 1774, which represents control software/firmware for the controller. In one example, controller 1770 includes host interface 1772, which represents an interface to host 1750. In one example, controller 1770 includes media interface 1776, which represents an interface to NAND die 1762. NAND die 1762 represents a specific example of NV media, and includes an associated NAND array 1764, which represents a 3D NAND array. NAND array 1764 includes arrays of BFC cells 1766 that are fabricated in accordance with the processes described and illustrated herein.

Media interface 1776 represents control that is executed on hardware of controller 1770. It will be understood that controller 1770 includes hardware to interface with host 1750, which can be considered to be controlled by host interface software/firmware 1774. Likewise, it will be understood that controller 1770 includes hardware to interface with NAND die 1762. In one example, code for host interface 1772 can be part of firmware 1774. In one example, code for media interface 1776 can be part of firmware 1774.

In one example, controller 1770 includes error control 1780 to handle data errors in accessed data, and corner cases in terms of compliance with signaling and communication interfacing. Error control 1780 can include implementations in hardware or firmware, or a combination of hardware and software.

The novel processing and fabrication techniques disclosed herein provide substantial scaling advantages over existing techniques. For example, with reference to a state-of-the-art FG memory cell in FIG. 5, the FG memory cell in FIG. 10 has a smaller number of processing steps inside of a memory hole and a flatter/longer cell dimension for a given WL pitch. The proposed FG cell eliminates the sacrificial process steps inside of the memory hole compared to the state-of-the-art FG cell design which results in near-vertical sides/flatter profile of FG cell films, as in FG cells 1510 and 1520 of FIG. 15. The control gate, IPD layers and storage nodes having cross-sections with vertical (i.e., flat) sides. Some of the IPD layers also have vertical sides, while others have sides that are substantially flat with a small amount of curvature towards the ends of the sides due to the nature of back-side wet etch mechanism. Notably, the profile of these IPD layers from the top to the bottom of the storage node is flat; the small curvature toward the ends has no impact on performance since no charge trapping occur through those portions of the IPD layers as a result of inter-WL airgap.

Use of simplified shapes leads to better, more consistent uniformity for FG memory cells at different locations in the 3D NAND devices. For example, the profile of FG memory cells at different wordlines for the same string (e.g., top, bottom, and middle wordlines) have similar configurations. The critical dimension (CD) of the memory holes (as measured at the top wordline layer) is substantially greater than current state-of-the-art FG cell architectures (e.g., 125 nm vs. 75 nm), which results in the diameter of the memory holes toward the lower wordline layers likewise being substantially greater. This leads to higher yields and higher reliability. The manufacturing process is also simplified, and stream-lined with that of the CTF cell technology for in-memory hole processing.

Although some embodiments have been described in reference to a particular implementation, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A memory device, comprising:

a stacked layer structure, including a plurality of wordline layers;

a plurality of vertical memory holes, formed in the stacked layer structure; and a plurality of stacked memory layers, each memory layer including an array of floating-gate memory cells in a respective wordline layer, comprising, a control gate;

a storage node; and a plurality of inter-poly dielectric (IPD) films disposed between the storage node and the control gate, wherein memory cells in different memory layers form strings of memory cells sharing a vertical memory hole, and wherein a cross-section profile of the control gate and storage node have vertical sides that are flat; and wherein the memory device further includes a plurality of inter-wordline airgaps between adjacent pairs of wordline layer, and the control gate and the storage node of each memory cell are exposed to air in a subset of corresponding inter-wordline airgaps.

2. The memory device of claim 1, wherein the control gate and storage node comprise polysilicon (poly-Si).

3. The memory device of claim 1, wherein the IPD films comprise:

a first silicon oxide film;

a first silicon nitride film adjacent to the first silicon oxide film; and a second silicon oxide film, adjacent to the first silicon nitride film.

4. The memory device of claim 3, wherein the IPD films further comprise a second silicon nitride film adjacent to the second silicon oxide film.

5. The memory device of claim 1, wherein the plurality of IPD films have vertical sides that are flat.

6. The memory device of claim 1, wherein the vertical memory holes pass through at least 50 wordline layers, and, for a string of memory cells, a level of uniformity of a first memory cell structure in a top wordline layer and a second memory cell structure in bottom wordline layer is substantially the same.

7. The memory device of claim 1, wherein fabrication of the memory device comprises:

fabricating a stacked layer structure comprising alternating layers of polysilicon and silicon nitride;

forming a plurality of memory holes passing vertically through the alternating layers of polysilicon and silicon nitride; performing in-memory hole processing under which multiple films of materials are formed over sidewalls of the plurality of memory holes;

forming each of the plurality of inter-wordline airgaps between a respective pair of polysilicon layers; and performing back-side isolation processing to selectively form memory cells in between respective pairs of polysilicon layers.

8. A method of fabricating a three-dimensional (3D) NAND memory device, comprising:

fabricating a stacked layer structure comprising alternating layers of polysilicon and a silicon nitride, the polysilicon layers to comprise wordlines;

forming an array of memory holes passing vertically through the alternating layers of polysilicon and silicon nitride;

performing in-memory hole processing under which multiple films of materials are sequentially formed over sidewalls of the memory holes;

forming inter-wordline airgaps between the polysilicon layers;

forming a control gate and a storage node in each layer of polysilicon, the control gate and the storage node are exposed to air in a subset of corresponding inter-wordline airgaps; and performing back-side isolation processing to selectively form floating-gate (FG) memory cells in the polysilicon layers.

9. The method of claim 8, wherein forming inter-wordline airgaps between the polysilicon layers comprises:

forming a plurality of replacement holes in the stacked layer structure, the replacement holes passing vertically through the alternating layers of polysilicon and silicon nitride; and introducing a first etchant into the replacement holes, the first etchant used to selectively exhume silicon nitride in the silicon nitride layers.

10. The method of claim 8, wherein in-memory hole processing includes performing a layer silicon nitride recess under which recesses in the silicon nitride layers are formed in the memory holes.

11. The method of claim 8, wherein in-memory hole processing includes sequentially forming inter-poly dielectric (IPD) films over the sidewalls of the memory holes, the IPD films including a first silicon nitride film, a first silicon oxide film, a second silicon nitride film, and a second silicon oxide film.

12. The method of claim 8, wherein in-memory hole processing includes:

sequentially forming multiple inter-poly dielectric (IPD) films over the sidewalls of the memory holes;

forming a first polysilicon film over a last of the IPD films;

forming a tunnel dielectric film over the first polysilicon film; and forming a polysilicon channel comprising a second polysilicon film over the tunnel dielectric film.

13. The method of claim 12, wherein the multiple IPD films comprise a first silicon oxide film, a first silicon nitride film, and second silicon oxide film, and wherein back-side isolation processing comprises:

using an etchant to selectively etch a thickness and/or portion of the first silicon oxide film between wordline layers with high selectivity to silicon nitride;

using an etchant to selectively etch a thickness and/or portion of the first silicon nitride film between wordline layers with high selectivity to silicon oxide;

using an etchant to selectively etch a thickness and/or portion of the second silicon oxide film between wordline layers with selectivity to silicon nitride; and using an etchant to selectively etch a thickness and/or portion of floating-gate polysilicon film between wordline layers to form isolated storage nodes with selectivity to previous IPD layers and a tunnel dielectric.

14. The method of claim 12, wherein the multiple IPD films comprise a first silicon oxide film, a first silicon nitride film, a second silicon oxide film, and a second silicon nitride film, and wherein back-side isolation processing comprises:

using an etchant to selectively etch a thickness and/or portion of the first silicon oxide film between wordline layers with selectivity to silicon nitride;

using an etchant selective to silicon oxide to selectively etch a portion of the first silicon nitride film between wordline layers;

using an etchant selective to silicon nitride to selectively etch a portion of the second silicon oxide film between wordline layers; and using an etchant selective to silicon oxide to selectively etch a portion of the second silicon nitride film between wordline layers; and using an etchant to selectively etch a portion of floating-gate polysilicon film between wordline layers to form storage nodes.

15. The method of claim 12, wherein cross-section profiles of the tunnel dielectric film and the polysilicon channel are substantially flat.

16. A system comprising:

a host, including a processor; and a three-dimensional (3D) NAND memory device, coupled to the host and having a stacked layer structure, the stacked layer structure further including a plurality of wordline layers;

a plurality of vertical memory holes, formed in the stacked layer structure; and a plurality of stacked memory layers, each memory layer including an array of floating-gate memory cells in a respective wordline layer, a memory cell comprising, a control gate;

a storage node; and a plurality of inter-poly dielectric (IPD) films disposed between the storage node and the control gate, wherein memory cells in different memory layers form strings of memory cells sharing a vertical memory hole, and wherein memory cells sharing a vertical memory hole in adjacent wordline layers are separated by inter-wordline airgaps; and wherein the control gate and the storage node of the memory cell are exposed to air in a subset of corresponding inter-wordline airgaps.

17. The system of claim 16, wherein a cross-section profile of the control gate and storage node for a memory cell have vertical sides that are straight.

18. The system of claim 16, wherein the IPD films comprise one of:

a first silicon oxide film;

a silicon nitride film adjacent to the first silicon oxide film; and a second silicon oxide film, adjacent to the silicon nitride film;

or a first silicon oxide film;

a first silicon nitride film adjacent to the first silicon oxide film;

a second silicon oxide film, adjacent to the first silicon nitride film; and a second silicon nitride film adjacent to the second silicon oxide film.

19. The system of claim 16, wherein the vertical memory holes pass through at least 50 wordline layers, and, for a string of memory cells, a level of uniformity of a first memory cell structure in a top wordline layer and a second memory cell structure in a bottom wordline layer is substantially the same.

20. The system of claim 16, wherein the stacked layer structure further includes a plurality of replacement holes distinct from the plurality of vertical memory holes, and the replacement holes pass vertically through the plurality of wordline layers and are connected to the inter-wordline airgaps.

* * * * *